United States Patent
Endo et al.

(10) Patent No.: US 11,454,889 B2
(45) Date of Patent: *Sep. 27, 2022

(54) CROSSLINKABLE COMPOUND-CONTAINING PHOTOCURABLE STEPPED SUBSTRATE-COATING COMPOSITION

(71) Applicant: NISSAN CHEMICAL CORPORATION, Tokyo (JP)

(72) Inventors: Takafumi Endo, Toyama (JP); Hikaru Tokunaga, Toyama (JP)

(73) Assignee: NISSAN CHEMICAL CORPORATION, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 16/637,974

(22) PCT Filed: Aug. 8, 2018

(86) PCT No.: PCT/JP2018/029809
§ 371 (c)(1),
(2) Date: Feb. 10, 2020

(87) PCT Pub. No.: WO2019/031556
PCT Pub. Date: Feb. 14, 2019

(65) Prior Publication Data
US 2020/0225585 A1    Jul. 16, 2020

(30) Foreign Application Priority Data
Aug. 9, 2017    (JP) .............................. JP2017-154599

(51) Int. Cl.
*G03F 7/11*    (2006.01)
*G03F 7/16*    (2006.01)
(Continued)

(52) U.S. Cl.
CPC .................. *G03F 7/11* (2013.01); *C09D 4/00* (2013.01); *C09D 7/63* (2018.01); *G03F 7/162* (2013.01);
(Continued)

(58) Field of Classification Search
CPC . G03F 7/11; G03F 7/162; G03F 7/168; C09D 4/00; C09D 7/63; H01L 21/0274
See application file for complete search history.

(56) References Cited

U.S. PATENT DOCUMENTS 8,048,615 B2    11/2011    Takei et al.
8,227,172 B2     7/2012    Horiguchi et al.
(Continued)

FOREIGN PATENT DOCUMENTS

JP    2004-533637 A    11/2004
JP    2013-186225 A     9/2013
(Continued)

OTHER PUBLICATIONS

Nov. 13, 2018 Search Report issued in International Patent Application No. PCT/JP2018/029809.
(Continued)

*Primary Examiner* — Bijan Ahvazi
(74) *Attorney, Agent, or Firm* — Oliff PLC

(57) ABSTRACT

A stepped substrate-coating composition for forming a coating film having filling property of a pattern and flattening property including a compound (E) having a partial structure (I) and a partial structure (II) having a hydroxy group formed by a reaction of an epoxy group with a proton-generating compound, a solvent (F), and a crosslinkable compound (H), wherein the partial structure (I) is from Formulae (1-1) to (1-5) or including a partial structure of Formula (1-6) combined with a partial structure of Formula (1-7) or (1-8), and the partial structure (II) is of the following Formula (2-1) or (2-2), wherein the compound (E) contains the epoxy and hydroxy group at a molar ratio (epoxy group)/(hydroxy group) of 0 or more and 0.5 or less, and contains the partial structure (II) so the molar ratio (partial structure (II))/(partial structure (I)+partial structure (II)) is 0.01 or more and 0.8 or less.

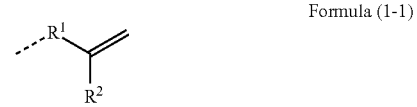

Formula (1-1)

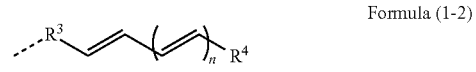

Formula (1-2)

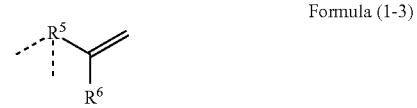

Formula (1-3)

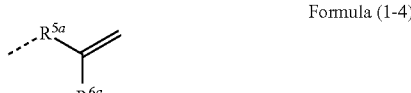

Formula (1-4)

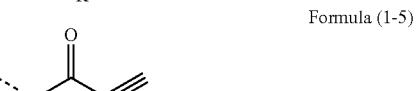

Formula (1-5)

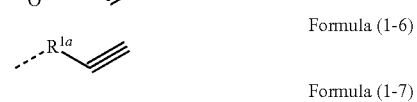

Formula (1-6)

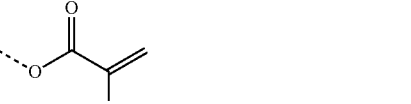

Formula (1-7)

(Continued)

-continued

Formula (1-8)

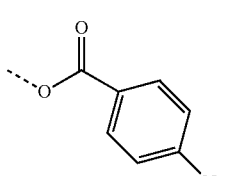

Formula (2-1)

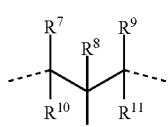

Formula (2-2)

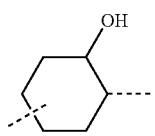

25 Claims, No Drawings

(51) Int. Cl.
*C09D 4/00* (2006.01)
*C09D 7/63* (2018.01)
*H01L 21/027* (2006.01)

(52) U.S. Cl.
CPC .......... *G03F 7/168* (2013.01); *H01L 21/0274* (2013.01)

(56) References Cited

U.S. PATENT DOCUMENTS

| | | | |
|---|---|---|---|
| 8,426,111 B2 | 4/2013 | Takei et al. | |
| 8,445,175 B2 | 5/2013 | Hiroi et al. | |
| 2009/0317740 A1* | 12/2009 | Hiroi ................ | C08G 63/6856 430/270.1 |
| 2018/0086886 A1 | 3/2018 | Sakamoto et al. | |
| 2018/0173101 A1* | 6/2018 | Lai ..................... | G03F 7/0392 |
| 2019/0079397 A1* | 3/2019 | Endo .................. | G03F 7/0236 |

FOREIGN PATENT DOCUMENTS

| | | | | |
|---|---|---|---|---|
| JP | 2013186225 A | * | 9/2013 | ............ C08F 290/00 |
| WO | 2006/115044 A1 | | 11/2006 | |
| WO | 2007/066597 A1 | | 6/2007 | |
| WO | 2007/148627 A1 | | 12/2007 | |
| WO | 2008/047638 A1 | | 4/2008 | |
| WO | 2009/008446 A1 | | 1/2009 | |
| WO | 2013/077358 A1 | | 5/2013 | |
| WO | WO-2013077358 A1 | * | 5/2013 | ............ G03F 7/027 |
| WO | 2016/159358 A1 | | 10/2016 | |

OTHER PUBLICATIONS

Nov. 13, 2018 Written Opinion of the International Searching Authority issued in International Patent Application No. PCT/JP2018/029809.

* cited by examiner

CROSSLINKABLE COMPOUND-CONTAINING PHOTOCURABLE STEPPED SUBSTRATE-COATING COMPOSITION

TECHNICAL FIELD

The present invention relates to a stepped substrate-coating composition for forming a flattened film on a stepped substrate by photocrosslinking, and a method for manufacturing a layered substrate that is flattened using the stepped substrate-coating composition.

BACKGROUND ART

In recent years, a semiconductor integrated circuit device has been processed in reference to a fine design rule. In order to form a finer resist pattern by an optical lithography technique, a decrease in wavelength of exposure light is required.

However, the depth of focus is decreased with the decrease in wavelength of exposure light, and therefore it is necessary to improve flattening property of a coating film formed on a substrate. That is, for manufacturing of a semiconductor device with a fine design rule, a flattening technique for a substrate is important.

Conventionally, a method of forming a flattened film, for example, a method of forming a resist underlayer film to be formed under a resist film by photocuring has been disclosed.

A resist underlayer film-forming composition containing a polymer having an epoxy group and an oxetane group in a side chain and a photo-cationic polymerization initiator, or a resist underlayer film-forming composition containing a polymer having a radically polymerizable ethylenically unsaturated bond and a photo-radical polymerization initiator is disclosed (see Patent Document 1).

A resist underlayer film-forming composition containing a silicon-containing compound having a cationically polymerizable reactive group such as an epoxy group or a vinyl group, a photo-cationic polymerization initiator, and a photo-radical polymerization initiator is disclosed (see Patent Document 2).

A method for manufacturing a semiconductor device using a resist underlayer film containing a polymer having a crosslinkable functional group (e.g., hydroxy group) in a side chain, a crosslinker, and a photoacid generator is disclosed (see Patent Document 3).

A resist underlayer film having an unsaturated bond in a main chain or a side chain, which is not a photocrosslinkable resist underlayer film, is disclosed (see Patent Documents 4 and 5).

PRIOR ART DOCUMENTS

Patent Documents

Patent Document 1: International publication WO 2006/115044
Patent Document 2: International publication WO 2007/066597
Patent Document 3: International publication WO 2008/047638
Patent Document 4: International publication WO 2009/008446
Patent Document 5: Japanese Patent Application Publication No. 2004-533637 (JP 2004-533637 A)

SUMMARY OF THE INVENTION

Problem to be Solved by the Invention

When a conventional photocrosslinking material, for example, a resist underlayer film-forming composition containing a polymer having a thermal crosslinking-forming functional group such as a hydroxy group, a crosslinker, and an acid catalyst (acid generator) is heated so as to fill a pattern (e.g., a hole or a trench structure) formed on a substrate, a crosslinking reaction proceeds, and the viscosity increases. Thus, there is a problem of insufficient filling of the pattern. Further, heat shrinkage due to degassing occurs, and therefore there is a problem in which evenness is impaired.

A resist underlayer film-forming composition containing a polymer having a cationically polymerizable reactive group such as an epoxy group or a vinyl group and an acid generator is subjected to irradiation with light and heating. In this case, heat shrinkage due to degassing occurs, and therefore there is a problem about evenness.

Accordingly, it is an object of the present invention to provide a stepped substrate-coating composition for forming a coating film on a substrate, which has high filling property of a pattern and flattening property capable of forming a coating film that does not cause degassing and heat shrinkage.

Means for Solving the Problems

A first aspect of the present invention is a photocurable stepped substrate-coating composition including a compound (E) having a partial structure (I) and a partial structure (II) that has a hydroxy group formed by a reaction of an epoxy group with a proton-generating compound, a solvent (F), and a crosslinkable compound (H), wherein the partial structure (I) is at least one partial structure selected from the group consisting of partial structures of the following Formulae (1-1) to (1-5) or a partial structure including a partial structure of Formula (1-6) in combination with a partial structure of Formula (1-7) or (1-8), and the partial structure (II) is a partial structure of the following Formula (2-1) or (2-2).

Formula (1-1)

Formula (1-2)

Formula (1-3)

Formula (1-4)

Formula (1-5)

-continued

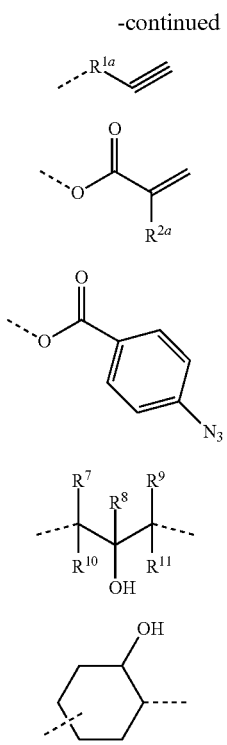

Formula (1-6)
Formula (1-7)
Formula (1-8)
Formula (2-1)
Formula (2-2)

(wherein $R^1$, $R^{1a}$, $R^3$, $R^5$, $R^{5a}$, and $R^{6a}$ are each independently a saturated $C_{1-10}$ hydrocarbon group, an aromatic $C_{6-40}$ hydrocarbon group, an oxygen atom, a carbonyl group, a sulfur atom, a nitrogen atom, an amide group, an amino group, or a group selected from combinations thereof, $R^2$, $R^{2a}$, $R^4$, and $R^6$ are each independently a hydrogen atom, a saturated $C_{1-10}$ hydrocarbon group, an unsaturated $C_{2-10}$ hydrocarbon group, an oxygen atom, a carbonyl group, an amide group, an amino group, or a group selected from combinations thereof, and are a monovalent group, $R^1$, $R^{1a}$, $R^3$, $R^{5a}$ and $R^{6a}$ are a divalent group, $R^5$ is a trivalent group, $R^7$, $R^8$, $R^9$, $R^{11}$, and are each independently a hydrogen atom or a saturated $C_{1-10}$ hydrocarbon group, n is the number of repeating units and is 1 to 10, and a dotted line is a chemical bond between adjacent atoms.)

A second aspect of the present invention is the photocurable stepped substrate-coating composition according to the first aspect further including an acid catalyst.

A third aspect of the present invention is the photocurable stepped substrate-coating composition according to the first or second aspect, wherein the compound (E) contains the epoxy group and the hydroxy group at a molar ratio (epoxy group)/(hydroxy group) of 0 or more and 0.5 or less, and contains the partial structure (II) so that the molar ratio (partial structure (II))/(partial structure (I)+partial structure (II)) is 0.01 or more and 0.8 or less.

A fourth aspect of the present invention is the photocurable stepped substrate-coating composition according to any one of the first to third aspects, wherein the compound (E) is a compound having at least one of the partial structure (I) and at least one of the partial structure (II).

A fifth aspect of the present invention is the photocurable stepped substrate-coating composition according to any one of the first to fourth aspects, wherein the $R^{5a}$ and $R^{6a}$ are each a divalent group selected from a $C_{1-10}$ alkylene group, a $C_{6-40}$ arylene group, an oxygen atom, a carbonyl group, a sulfur atom, or combinations thereof.

A sixth aspect of the present invention is the photocurable stepped substrate-coating composition according to any one of the first to fifth aspects, wherein the compound (E) is a compound (1) obtained by a reaction of a proton-generating compound (A) having an unsaturated bond between carbon atoms with an epoxy compound (B), a compound (2) obtained by a reaction of an epoxy compound (C) having an unsaturated bond between carbon atoms with a proton-generating compound (D), a compound (3) obtained by a reaction of a proton-generating compound (A) having an unsaturated bond between carbon atoms and a proton-generating compound (A') having a photodegradable group with an epoxy compound (B), or a compound (4) obtained by a reaction of a hydroxy group formed by a reaction of an epoxy compound (B) or an epoxy compound (C) having an unsaturated bond between carbon atoms with a proton-generating compound (A) having an unsaturated bond between carbon atoms, a proton-generating compound (A) having an unsaturated bond between carbon atoms and a proton-generating compound (A') having a photodegradable group, or a proton-generating compound (D) with a compound (G) having an unsaturated bond and capable of being reacted with the hydroxy group.

A seventh aspect of the present invention is the photocurable stepped substrate-coating composition according to the sixth aspect, wherein when the compound (E) is the compound (1), the compound (3), or the compound (4), the compound (E) is obtained by a reaction of a proton generated from the proton-generating compound (A) having an unsaturated bond between carbon atoms or the proton-generating compound (A) having an unsaturated bond between carbon atoms and the proton-generating compound (A') having a photodegradable group with an epoxy group of the epoxy compound (B) at a molar ratio of 1:1 to 1:1.5.

An eighth aspect of the present invention is the photocurable stepped substrate-coating composition according to the sixth aspect, wherein when the compound (E) is the compound (2) or the compound (4), the compound (E) is obtained by a reaction of an epoxy group of the epoxy compound (C) having an unsaturated bond between carbon atoms with a proton generated from the proton-generating compound (D) at a molar ratio of 1:1 to 1.5:1.

A ninth aspect of the present invention is the photocurable stepped substrate-coating composition according to the sixth or seventh aspect, wherein the proton-generating compound (A) having an unsaturated bond between carbon atoms is a carboxylic acid compound having an unsaturated bond between carbon atoms, an acid anhydride having an unsaturated bond between carbon atoms, an amine compound having an unsaturated bond between carbon atoms, an amide compound having an unsaturated bond between carbon atoms, an isocyanurate compound having an unsaturated bond between carbon atoms, a phenol compound having an unsaturated bond between carbon atoms, or a thiol compound having an unsaturated bond between carbon atoms.

A tenth aspect of the present invention is the photocurable stepped substrate-coating composition according to the sixth or seventh aspect, wherein the epoxy compound (B) is a glycidyl group-containing ether compound, a reaction product of a phenolic hydroxy group-containing compound and epichlorohydrin, a reaction product of a phenolic hydroxy group-containing resin and epichlorohydrin, a glycidyl group-containing isocyanurate compound, an epoxycyclohexyl group-containing compound, an epoxy group-substituted cyclohexyl compound, or a glycidyl ester compound.

An eleventh aspect of the present invention is the photocurable stepped substrate-coating composition according to the sixth or seventh aspect, wherein the proton-generating compound (A') having a photodegradable group is an azide group-containing compound.

A twelfth aspect of the present invention is the photocurable stepped substrate-coating composition according to the sixth or eighth aspect, wherein the epoxy compound (C) having an unsaturated bond between carbon atoms is a glycidyl ester compound having an unsaturated bond between carbon atoms, a reaction product of a phenolic hydroxy group-containing compound having an unsaturated bond between carbon atoms and epichlorohydrin, or a reaction product of a phenolic hydroxy group-containing resin having an unsaturated bond between carbon atoms and epichlorohydrin.

A thirteenth aspect of the present invention is the photocurable stepped substrate-coating composition according to the sixth or eighth aspect, wherein the proton-generating compound (D) is a phenolic hydroxy group-containing compound, a carboxylic acid-containing compound, an amine-containing compound, a thiol-containing compound, or an imide-containing compound.

A fourteenth aspect of the present invention is the photocurable stepped substrate-coating composition according to the sixth or eighth aspect, wherein the compound (G) is an acid halide, an acid anhydride, an isocyanate compound, or a halogenated alkyl compound that has an unsaturated bond between carbon atoms, or the proton-generating compound (A) having an unsaturated bond between carbon atoms.

A fifteenth aspect of the present invention is the photocurable stepped substrate-coating composition according to any one of the first to fourteenth aspects, wherein the compound (E) has the partial structure (I) and the partial structure (II) in a proportion of each of the partial structures (I) and (II) of 1 to 1,000 structures.

A sixteenth aspect of the present invention is the photocurable stepped substrate-coating composition according to any one of the first to fifteenth aspects, which is a resist underlayer film-forming composition used in a lithography process in manufacturing of a semiconductor device.

A seventeenth aspect of the present invention is a method for manufacturing a coated substrate including steps of (i) applying the photocurable stepped substrate-coating composition according to any one of the first to sixteenth aspects to a stepped substrate, and (ii) exposing the composition.

An eighteenth aspect of the present invention is the method for manufacturing a coated substrate according to the seventeenth aspect, further including a step (ia) of heating the photocurable stepped substrate-coating composition at a temperature of 70 to 400° C. for 10 seconds to 5 minutes after the composition is applied in the step (i).

A nineteenth aspect of the present invention is the method for manufacturing a coated substrate according to the seventeenth or eighteenth aspect, wherein the wavelength of exposure light in the step (ii) is 150 nm to 248 nm.

A twentieth aspect of the present invention is the method for manufacturing a coated substrate according to any one of the seventeenth to nineteenth aspects, wherein the exposure dose in the step (ii) is 10 mJ/cm$^2$ to 3,000 mJ/cm$^2$.

A twenty-first aspect of the present invention is the method for manufacturing a coated substrate according to any one of the seventeenth to twentieth aspects, wherein the substrate has an open area (unpatterned area) and a pattern area including dense (DENCE) and crude (ISO) pattern areas, and the aspect ratio of patterns at the pattern area is 0.1 to 10.

A twenty-second aspect of the present invention is the method for manufacturing a coated substrate according to any one of the seventeenth to twenty-first aspects, wherein the difference in level of coating (Bias) between the open area and the pattern area is 1 to 50 nm.

A twenty-third aspect of the present invention is a method for manufacturing a semiconductor device including steps of: forming an underlayer film from the photocurable stepped substrate-coating composition according to any one of the first to sixteenth aspects on a stepped substrate; forming a resist film on the underlayer film; forming a resist pattern by irradiation of the resist film with light or an electron beam and development; etching the underlayer film using the resist pattern formed to form a patterned underlayer film; and processing a semiconductor substrate by using the patterned underlayer film.

A twenty-fourth aspect of the present invention is the method for manufacturing a semiconductor device according to the twenty-third aspect, wherein the stepped substrate has an open area (unpatterned area) and a pattern area including dense (DENCE) and crude (ISO) pattern areas, and the aspect ratio of patterns at the pattern area is 0.1 to 10.

A twenty-fifth aspect of the present invention is the method for manufacturing a semiconductor device according to the twenty-third aspect, wherein the step of forming an underlayer film from the photocurable stepped substrate-coating composition includes steps of (i) applying the photocurable stepped substrate-coating composition according to any one of the first to sixteenth aspects to the stepped substrate and (ii) exposing the composition.

A twenty-sixth aspect of the present invention is the method for manufacturing a semiconductor device according to the twenty-fifth aspect, further including a step (ia) of heating the photocurable stepped substrate-coating composition at a temperature of 70 to 400° C. for 10 seconds to 5 minutes after the composition is applied in the step (i).

A twenty-seventh aspect of the present invention is the method for manufacturing a semiconductor device according to the twenty-fifth or twenty-sixth aspect, wherein the wavelength of exposure light in the step (ii) is 150 nm to 248 nm.

A twenty-eighth aspect of the present invention is the method for manufacturing a semiconductor device according to any one of the twenty-fifth to twenty-seventh aspects, wherein the exposure dose in the step (ii) is 10 mJ/cm$^2$ to 3,000 mJ/cm$^2$.

A twenty-ninth aspect of the present invention is the method for manufacturing a semiconductor device according to the twenty-third aspect, wherein the underlayer film formed from the photocurable stepped substrate-coating composition has a difference in level of coating of 1 to 50 nm.

A thirtieth aspect of the present invention is a method for manufacturing a semiconductor device including steps of: forming an underlayer film from the photocurable stepped substrate-coating composition according to any one of the first to sixteenth aspects on a stepped substrate; forming a hard mask on the underlayer film; forming a resist film on the hard mask; forming a resist pattern by irradiation of the resist film with light or an electron beam and development; etching the hard mask using the resist pattern formed to form a patterned hard mask; etching the underlayer film using the patterned hard mask to form a patterned underlayer film; and processing a semiconductor substrate by using the patterned underlayer film.

A thirty-first aspect of the present invention is the method for manufacturing a semiconductor device according to the thirtieth aspect, wherein the stepped substrate has an open area (unpatterned area) and a pattern area including dense (DENCE) and crude (ISO) pattern areas, and the aspect ratio of patterns at the pattern area is 0.1 to 10.

A thirty-second aspect of the present invention is the method for manufacturing a semiconductor device according to the thirtieth aspect, wherein the step of forming an underlayer film from the photocurable stepped substrate-coating composition includes steps of (i) applying the photocurable stepped substrate-coating composition according to any one of the first to sixteenth aspects to the stepped substrate and (ii) exposing the composition.

A thirty-third aspect of the present invention is the method for manufacturing a semiconductor device according to the thirty-second aspect, further including a step (ia) of heating the photocurable stepped substrate-coating composition at a temperature of 70 to 400° C. for 10 seconds to 5 minutes after the composition is applied in the step (i).

A thirty-fourth aspect of the present invention is the method for manufacturing a semiconductor device according to the thirty-second or thirty-third aspect, wherein the wavelength of exposure light in the step (ii) is 150 nm to 248 nm.

A thirty-fifth aspect of the present invention is the method for manufacturing a semiconductor device according to any one of the thirty-second to thirty-fourth aspects, wherein the exposure dose in the step (ii) is 10 mJ/cm$^2$ to 3,000 mJ/cm$^2$.

A thirty-sixth aspect of the present invention is the method for manufacturing a semiconductor device according to the thirtieth aspect, wherein the underlayer film formed from the photocurable stepped substrate-coating composition has a difference in level of coating of 1 to 50 nm.

Effects of the Invention

In the present invention, in terms of photocuring property of a film of the stepped substrate-coating composition, when sufficient photocuring to the bottom of the film is not completed, the film-flattening property of the stepped substrate-coating composition of the present invention may be deteriorated by post-heating after irradiation of the film of the stepped substrate-coating composition with light or application of heat from the upper surface of the film of the stepped substrate-coating composition in case of coating an upper layer with a hard mask or a resist. The film of the stepped substrate-coating composition may be not sufficiently cured to the bottom of the film. When this stepped substrate-coating composition contains a thermosetting crosslinkable compound, curing proceeds under heating during drying the stepped substrate-coating composition, and photocuring is promoted. Therefore, the stepped substrate-coating composition can be completely cured. When the stepped substrate-coating composition contains the thermosetting crosslinkable compound, an acid catalyst may be further added.

The stepped substrate-coating composition of the present invention has a photocrosslinking function and a thermal crosslinking function. Therefore, the generation of sublimate during thermal crosslinking is suppressed as compared with a case of only thermal crosslinking, and sufficient curing to the bottom of the film is achieved by a combination of photocrosslinking with thermal crosslinking. Accordingly, even when post-heating is performed after curing the film of the stepped substrate-coating composition of the present invention or heat is generated during layering a hard mask or the like on the upper layer of the film by vapor deposition or application, the film-flattening property of the stepped substrate-coating composition of the present invention is not deteriorated.

After the stepped substrate-coating composition is applied to a stepped substrate, thermal curing is caused by heating. However, the stepped substrate-coating composition is not completely cured only by thermal curing. Therefore, the stepped substrate-coating composition is flowable during heating, and is completely cured by subsequent photocuring. Thermal curing is advanced by a reaction of the partial structure (II) with the crosslinkable compound (H). It is preferable that the crosslinkable compound (H) be added to the stepped substrate-coating composition in such an amount that 30% to 90%, 50% to 90%, or 50% to 80% of curing is completed by thermal curing. Herein, the degree of curing in which 100% of solvent resistance is developed is defined as 100%.

MODES FOR CARRYING OUT THE INVENTION

The present invention is a photocurable stepped substrate-coating composition including a compound (E) having a partial structure (I) and a partial structure (II), a solvent (F), and a crosslinkable compound (H), wherein the partial structure (II) contains a hydroxy group formed by a reaction of an epoxy group with a proton-generating compound, the partial structure (I) is at least one partial structure selected from the group consisting of partial structures of Formulae (1-1) to (1-5) or a partial structure including a partial structure of Formula (1-6) in combination with a partial structure of Formula (1-7) or (1-8), and the partial structure (II) is a partial structure of Formula (2-1) or (2-2).

The stepped substrate-coating composition may further contain an acid catalyst.

The partial structure (I) includes the partial structure of Formula (1-1), the partial structure of Formula (1-2), the partial structure of Formula (1-3), the partial structure of Formula (1-4), the partial structure of Formula (1-5), a combination of the partial structure of Formula (1-6) with the partial structure of Formula (1-7), or a combination of the partial structure of Formula (1-6) with the partial structure of Formula (1-8). The partial structure (I) includes a combination of the partial structure of Formula (1-1) with the partial structure of Formula (1-3) or a combination of the partial structure of Formula (1-1) with the partial structure of Formula (1-4).

In Formulae (1-1) to (1-4), (1-6), (1-7), and (2-1), $R^1$, $R^{1a}$, $R^3$, $R^5$, $R^{5a}$, and $R^{6a}$ are each independently a saturated $C_{1-10}$ hydrocarbon group, an aromatic $C_{6-40}$ hydrocarbon group, an oxygen atom, a carbonyl group, a sulfur atom, a nitrogen atom, an amide group, an amino group, or a group selected from combinations thereof, $R^2$, $R^{2a}$, $R^4$, and $R^6$ are each independently a hydrogen atom, a saturated $C_{1-10}$ hydrocarbon group, an unsaturated $C_{2-10}$ hydrocarbon group, an oxygen atom, a carbonyl group, an amide group, an amino group, or a group selected from combinations thereof, $R^2$, $R^{2a}$, and $R^6$ are a monovalent group, $R^1$, $R^{1a}$, $R^3$, $R^{5a}$, and $R^{6a}$ are a divalent group, $R^5$ is a trivalent group, $R^7$, $R^8$, $R^9$, $R^{10}$, and $R^{11}$ are each independently a hydrogen atom or a saturated $C_{1-10}$ hydrocarbon group, n is the number of repeating units and is 1 to 10, and a dotted line is a chemical bond between adjacent atoms.

In Formula (1-4), $R^{5a}$ and $R^{6a}$ may be each a divalent group selected from a $C_{1-10}$ alkylene group, a $C_{6-40}$ arylene group, an oxygen atom, a carbonyl group, a sulfur atom, or combinations thereof.

A dotted line moiety of $R^1$ of Formula (1-1), a dotted line moiety of $R^3$ of Formula (1-2), a dotted line moiety of $R^5$ of Formula (1-3), dotted line moieties of $R^{5a}$ and $R^{6a}$ of Formula (1-4), a dotted line moiety of oxygen atom of ester group of Formula (1-5), a dotted line moiety of $R^{1a}$ of Formula (1-6), a dotted line moiety of oxygen atom of ester group of Formula (1-7), and a dotted line moiety of oxygen atom of ester group of Formula (1-8) each form a chemical bond with a dotted line moiety of Formula (2-1) and a dotted line moiety of Formula (2-2).

The stepped substrate-coating composition may contain an additive such as a surfactant, if necessary.

The solid content of the stepped substrate-coating composition is 0.1 to 70% by mass, 0.1 to 60% by mass, 0.2 to 30% by mass, or 0.3 to 15% by mass. The solid content is the content ratio of all components other than the solvent in the stepped substrate-coating composition. The stepped substrate-coating composition may contain the compound (E) in an amount of 1 to 100% by mass, 1 to 99.9% by mass, 50 to 99.9% by mass, 50 to 95% by mass, or 50 to 90% by mass, relative to the solid content.

The compound (E) used in the present invention has an average molecular weight of 600 to 1,000,000, 600 to 200,000, or 1,500 to 15,000.

A crosslinking structure can be formed by a photoreaction of an unsaturated bond between carbon atoms between molecules or in a molecule of the compound (E). The compound (E) may have at least one unsaturated bond between carbon atoms, that is, an unsaturated double bond between carbon atoms, in the molecule. The compound (E) may have a plurality of (e.g., 1 to 1,000) unsaturated bonds between carbon atoms in the molecule.

In the compound (E), the partial structures (I) and (II) can be modified so that the molar ratio (partial structure (II))/(partial structure (I)+partial structure (II)) falls within a range of 0.01 or more and 0.8 or less. The compound (E) may be a compound having at least one partial structure (I) and at la least one partial structure (II).

When the molar ratio (partial structure (II))/(partial structure (I)+partial structure (II)) is more than 0.8, the proportion of a functional group capable of a photoreaction is decreased, which is not preferable. When the molar ratio (partial structure (II))/(partial structure (I)+partial structure (II)) is less than 0.01, the stability of the photocurable stepped substrate-coating composition is reduced, and the adhesion and application property of the photocurable stepped substrate-coating composition to a substrate are reduced, which is not preferable.

The saturated $C_{1-10}$ hydrocarbon group may be a $C_{1-10}$ alkyl group. Examples thereof include methyl group, ethyl group, n-propyl group, i-propyl group, cyclopropyl group, n-butyl group, i-butyl group, s-butyl group, t-butyl group, cyclobutyl group, 1-methyl-cyclopropyl group, 2-methyl-cyclopropyl group, n-pentyl group, 1-methyl-n-butyl group, 2-methyl-n-butyl group, 3-methyl-n-butyl group, 1,1-dimethyl-n-propyl group, 1,2-dimethyl-n-propyl group, 2,2-dimethyl-n-propyl group, 1-ethyl-n-propyl group, cyclopentyl group, 1-methyl-cyclobutyl group, 2-methyl-cyclobutyl group, 3-methyl-cyclobutyl group, 1,2-dimethyl-cyclopropyl group, 2,3-dimethyl-cyclopropyl group, 1-ethyl-cyclopropyl group, 2-ethyl-cyclopropyl group, n-hexyl group, 1-methyl-n-pentyl group, 2-methyl-n-pentyl group, 3-methyl-n-pentyl group, 4-methyl-n-pentyl group, 1,1-dimethyl-n-butyl group, 1,2-dimethyl-n-butyl group, 1,3-dimethyl-n-butyl group, 2,2-dimethyl-n-butyl group, 2,3-dimethyl-n-butyl group, 3,3-dimethyl-n-butyl group, 1-ethyl-n-butyl group, 2-ethyl-n-butyl group, 1,1,2-trimethyl-n-propyl group, 1,2,2-trimethyl-n-propyl group, 1-ethyl-1-methyl-n-propyl group, 1-ethyl-2-methyl-n-propyl group, cyclohexyl group, 1-methyl-cyclopentyl group, 2-methyl-cyclopentyl group, 3-methyl-cyclopentyl group, 1-ethyl-cyclobutyl group, 2-ethyl-cyclobutyl group, 3-ethyl-cyclobutyl group, 1,2-dimethyl-cyclobutyl group, 1,3-dimethyl-cyclobutyl group, 2,2-dimethyl-cyclobutyl group, 2,3-dimethyl-cyclobutyl group, 2,4-dimethyl-cyclobutyl group, 3,3-dimethyl-cyclobutyl group, 1-n-propyl-cyclopropyl group, 2-n-propyl-cyclopropyl group, 1-i-propyl-cyclopropyl group, 2-i-propyl-cyclopropyl group, 1,2,2-trimethyl-cyclopropyl group, 1,2,3-trimethyl-cyclopropyl group, 2,2,3-trimethyl-cyclopropyl group, 1-ethyl-2-methyl-cyclopropyl group, 2-ethyl-1-methyl-cyclopropyl group, 2-ethyl-2-methyl-cyclopropyl group, and 2-ethyl-3-methyl-cyclopropyl group.

Examples of the saturated $C_{1-10}$ hydrocarbon group include divalent alkylene groups derived from the aforementioned alkyl groups.

Examples of the unsaturated $C_{2-10}$ hydrocarbon group include alkenyl groups or alkynyl groups corresponding to the aforementioned alkyl groups having a carbon atom number of 2 or more.

The aromatic $C_{6-40}$ hydrocarbon group may be a divalent $C_{6-40}$ arylene group. Examples thereof include phenylene group, biphenylene group, terphenylene group, fluorenylene group, naphthylene group, anthrylene group, pyrenylene group, and carbazolylene group.

In Formula (1-4) of the partial structure (I), $R^{5a}$ and $R^{6a}$ may be each a divalent group selected from a $C_{1-10}$ alkylene group, a $C_{6-40}$ arylene group, an oxygen atom, a carbonyl group, a sulfur atom, or combinations thereof.

In the partial structure (I), Formula (1-4) is bonded to a unit structure of Formula (II) to form a linear polymer. When $R^{5a}$ and $R^{6a}$ are selected from these groups, the performance of forming a crosslinking structure by a photoreaction is enhanced, which is preferable.

The compound (E) may also be a compound (1) obtained by a reaction of a proton-generating compound (A) having an unsaturated bond between carbon atoms with an epoxy compound (B), a compound (2) obtained by a reaction of an epoxy compound (C) having an unsaturated bond between carbon atoms with a proton-generating compound (D), a compound (3) obtained by a reaction of a proton-generating compound (A) having an unsaturated bond between carbon atoms and a proton-generating compound (A') having a photodegradable group with an epoxy compound (B), or a compound (4) obtained by a reaction of a hydroxy group formed by a reaction of an epoxy compound (B) or an epoxy compound (C) having an unsaturated bond between carbon atoms with a proton-generating compound (A) having an unsaturated bond between carbon atoms, a proton-generating compound (A) having an unsaturated bond between carbon atoms and a proton-generating compound (A') having a photodegradable group, or a proton-generating compound (D) with a compound (G) having an unsaturated bond and capable of being reacted with the hydroxy group.

The partial structure (II) contains a hydroxy group formed by a reaction of an epoxy group with a proton-generating compound, and the compound (E) may contain the epoxy group and the hydroxy group at a molar ratio (epoxy group)/(hydroxy group) of 0 or more and 0.5 or less. The epoxy compound (B) or (C) is reacted with the proton-generating compound (A) or (D), to cause an addition reaction of an epoxy group. As a result, a hydroxy group is formed. The ratio during the addition reaction is a molar ratio (epoxy group)/(hydroxy group) of 0 or more and 0.5 or less. It is preferable that the amount of residual epoxy group be small. It is desirable that the amount of the epoxy group in the compound (E) be zero or approximately zero in terms of photoreactive property.

When the compound (E) is the compound (1), (3), or (4), the compound (E) may be obtained by a reaction of the proton-generating compound (A) having an unsaturated bond between carbon atoms or protons generated from the proton-generating compound (A) having an unsaturated bond between carbon atoms and the proton-generating compound (A') having a photodegradable group with an epoxy group of the epoxy compound (B) at a molar ratio of 1:1 to 1:1.5.

When the compound (E) is the compound (2) or (4), the compound (E) may be obtained by a reaction of an epoxy group of the epoxy compound (C) having an unsaturated bond between carbon atoms with protons generated from the proton-generating compound (D) at a molar ratio of 1:1 to 1.5:1.

A proton-generating group of the proton-generating compound (A) having an unsaturated bond between carbon atoms is reacted with the epoxy group of the epoxy compound (B) to form the partial structures (I) and (II). $R^1$, $R^3$, $R^5$, $R^{5a}$, $R^{6a}$, $R^{1a}$, and the oxygen atom of the ester group of the partial structure (I) form a bond with a carbon atom between $R^7$ and $R^{10}$, a carbon atom between $R^9$ and $R^{11}$, or a hydroxycyclohexyl ring of the partial structure (II).

Examples of the proton-generating compound (A) having an unsaturated bond between carbon atoms include a carboxylic acid compound having an unsaturated bond between carbon atoms, an acid anhydride having an unsaturated bond between carbon atoms, an amine compound having an unsaturated bond between carbon atoms, an amide compound having an unsaturated bond between carbon atoms, an isocyanurate compound having an unsaturated bond between carbon atoms, a phenol compound having an unsaturated bond between carbon atoms, or a thiol compound having an unsaturated bond between carbon atoms.

Examples of the epoxy compound (B) include a glycidyl group-containing ether compound, a reaction product of a phenolic hydroxy group-containing compound and epichlorohydrin, a reaction product of a phenolic hydroxy group-containing resin and epichlorohydrin, a glycidyl group-containing isocyanurate compound, an epoxycyclohexyl group-containing compound, an epoxy group-substituted cyclohexyl compound, or a glycidyl ester compound.

The epoxy group of the epoxy compound (C) having an unsaturated bond between carbon atoms is reacted with a proton-generating group of the proton-generating compound (D) to form the partial structures (I) and (II). $R^1$, $R^3$, $R^5$, $R^{5a}$, $R^{6a}$, $R^{1a}$, and the oxygen atom of the ester group of the partial structure (I) form a bond with a carbon atom between $R^7$ and $R^{10}$ or between $R^9$ and $R^{11}$, or a hydroxycyclohexyl ring of the partial structure (II).

Examples of the epoxy compound (C) having an unsaturated bond between carbon atoms include a glycidyl ester compound having an unsaturated bond between carbon atoms, a reaction product of a phenolic hydroxy group-containing compound having an unsaturated bond between carbon atoms and epichlorohydrin, or a reaction product of a phenolic hydroxy group-containing resin having an unsaturated bond between carbon atoms and epichlorohydrin.

Examples of the proton-generating compound (D) include a phenolic hydroxy group-containing compound, a carboxylic acid-containing compound, an amine-containing compound, a thiol-containing compound, or an imide-containing compound.

The proportion of a group having an unsaturated bond between carbon atoms derived from the partial structure (I) and the hydroxy group derived from the partial structure (II) can correspond to a molar ratio (partial structure (II))/(partial structure (I)+partial structure (II)) of 0.01 or more and 0.8 or less. When in a reaction of the compound (A) with the compound (B) or a reaction of the compound (C) with the compound (D), the proton-generating group contained in the compounds is reacted with the epoxy group contained in the compounds at a molar ratio of 1:1, the group having an unsaturated bond between carbon atoms derived from the partial structure (I) and the hydroxy group derived from the partial structure (II) are produced at a molar ratio of 1:1. However, when as a compound having a proton-generating group, any compound having no unsaturated bond between carbon atoms is used, the proportion of hydroxy group to be produced is increased. In the present invention, the molar ratio is up to 1:4.

The compound (E) may contain the partial structures (I) and (II) in a proportion of each of the partial structures (I) and (II) of 1 to 1,000 structures. This means that the compound (E) includes a monomolecular compound to a polymer, and includes the partial structures in the proportion falling within the aforementioned range.

Examples of the proton-generating compound (A) having an unsaturated bond between carbon atoms used in the present invention are as follows.

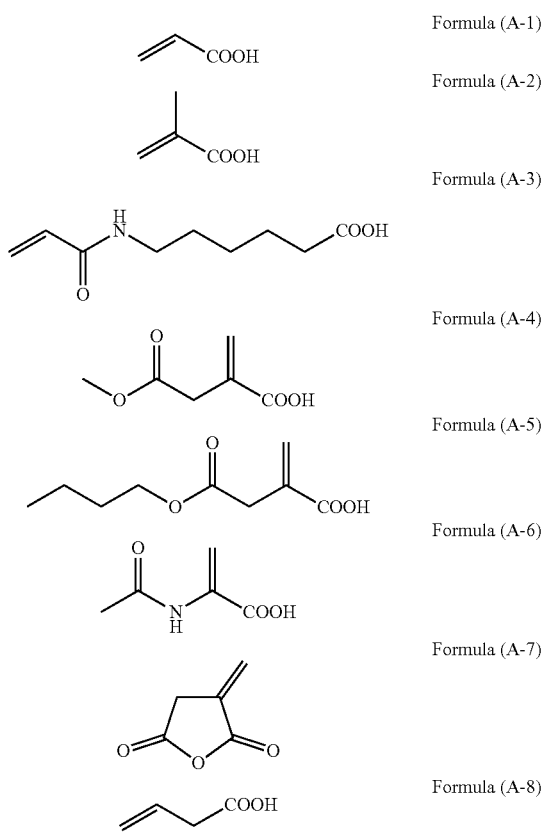

-continued

Formula (A-9)
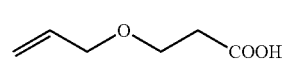

Formula (A-10)
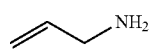

Formula (A-11)
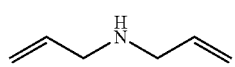

Formula (A-12)
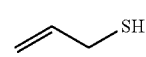

Formula (A-13)
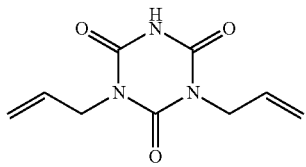

Formula (A-14)
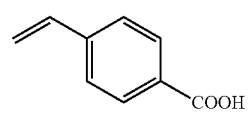

Formula (A-15)
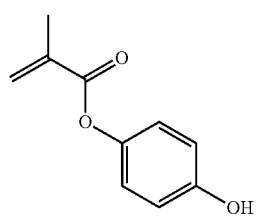

Formula (A-16)
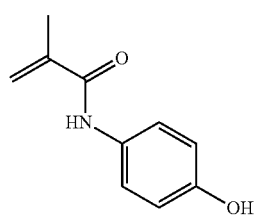

Formula (A-17)
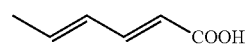

Formula (A-18)
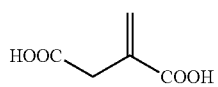

Formula (A-19)
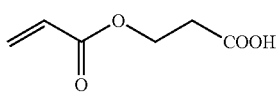

Formula (A-20)
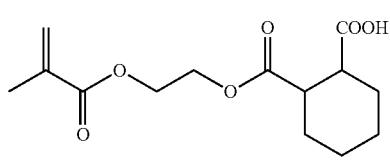

Formula (A-21)
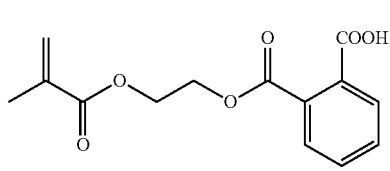

Formula (A-22)
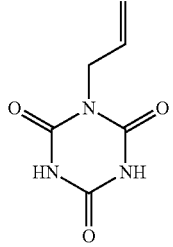

Formula (A-23)
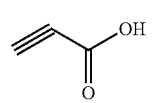

Formula (A-24)
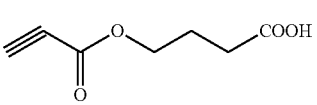

The compounds are available as a reagent.

Examples of the proton-generating compound (A') having a photodegradable group used in the present invention include the following azide group-containing compounds.

Examples of the photodegradable group include a photodegradable nitrogen-containing group. When the photodegradable nitrogen-containing group is irradiated with light, a nitrogen gas is generated to produce a chemical group containing a reactive nitrogen moiety (nitrene group) or a reactive carbon moiety (carbene group). The reactive nitrogen moiety is also referred to as nitrene group. For example, the reactive nitrogen moiety is reacted with an alkene or a benzene ring to form an aziridine ring or the like, and as a result, crosslinking proceeds.

Formula (A'-1)
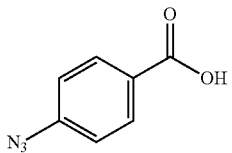

Formula (A'-2)
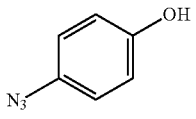

Formula (A'-3)
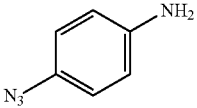

Formula (A'-4)
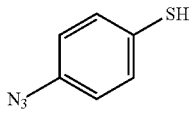

Examples of the epoxy compound (B) used in the present invention are as follows.
Formula (B-1)
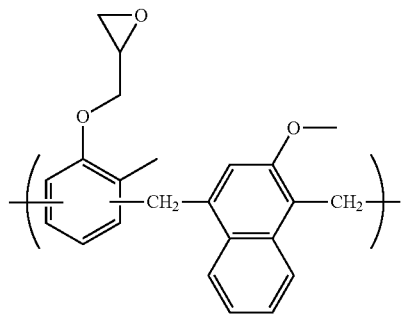
Formula (B-2)
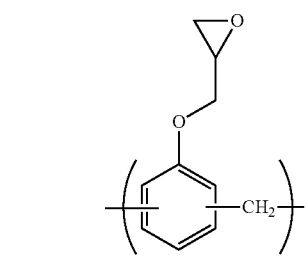
Formula (B-3)
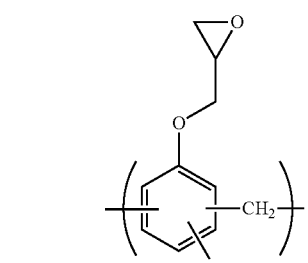
Formula (B-4)
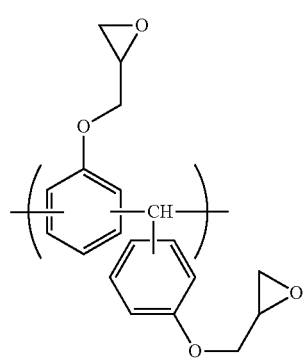
Formula (B-5)
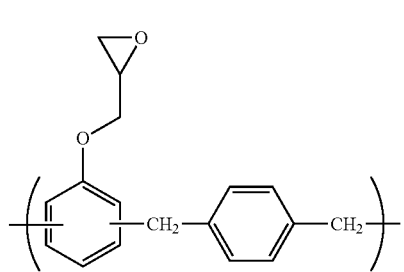
-continued
Formula (B-6)
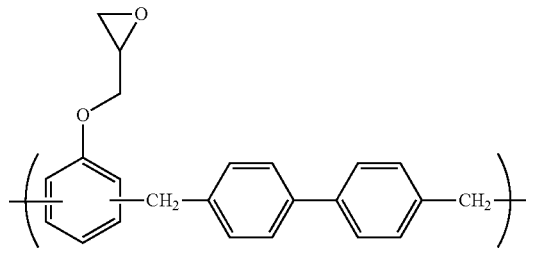
Formula (B-7)
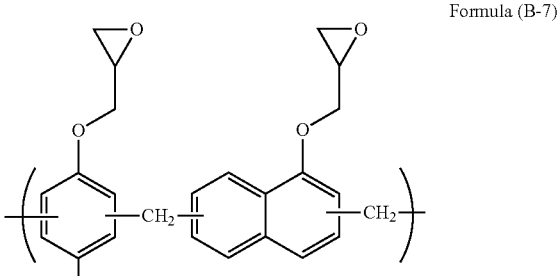
Formula (B-8)
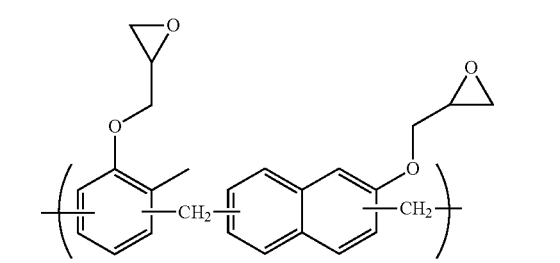
Formula (B-9)
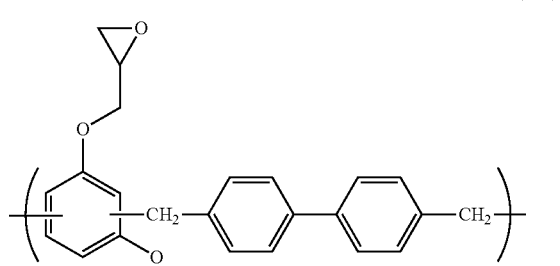
Formula (B-10)
Formula (B-11)
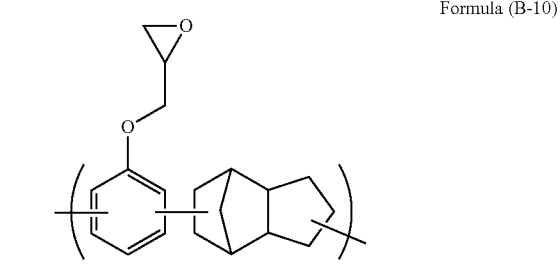

Formula (B-12)
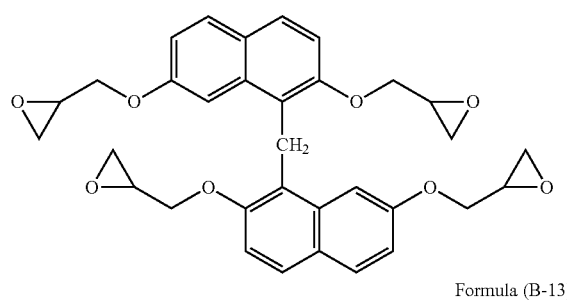
Formula (B-13)
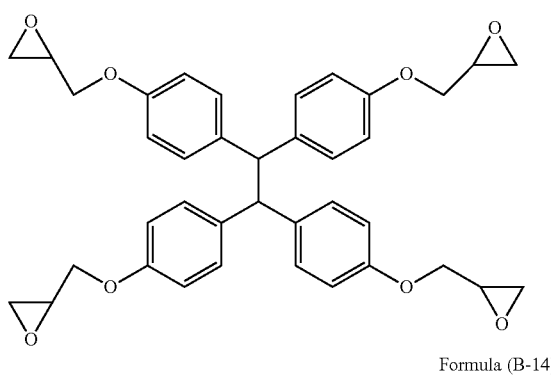
Formula (B-14)
Formula (B-15)
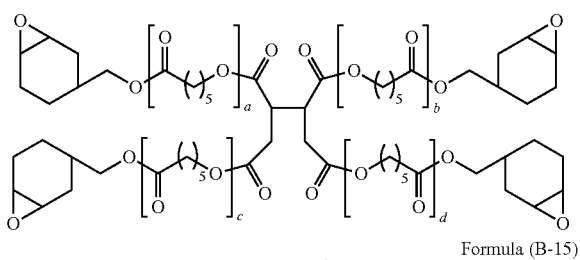
Formula (B-16)
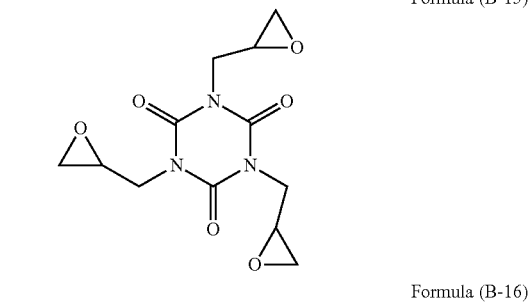
Formula (B-17)
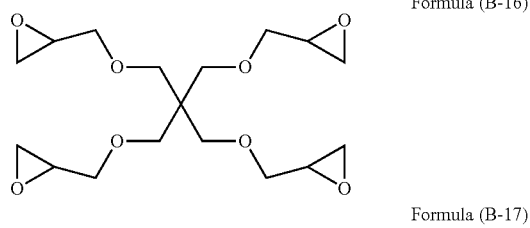
Formula (B-18)
Formula (B-19)
Formula (B-20)
Formula (B-21)
Formula (B-22)
Formula (B-23)
Formula (B-24)

-continued

Formula (B-25)

Formula (B-26)

The compound of Formula (B-1) is available as EPICLON HP-5000, trade name, from DIC Corporation.

The compound of Formula (B-2) is available as EPPN-501H, trade name, from Nippon Kayaku Co., Ltd.

The compound of Formula (B-3) is available as ECN-1229, trade name, from Asahi Kasei Epoxy Co., Ltd.

The compound of Formula (B-4) is available as EPPN-501H, trade name, from Nippon Kayaku Co., Ltd.

The compound of Formula (B-5) is available as NC-2000L, trade name, from Nippon Kayaku Co., Ltd.

The compound of Formula (B-6) is available as NC-3000L, trade name, from Nippon Kayaku Co., Ltd.

The compound of Formula (B-7) is available as NC-7000L, trade name, from Nippon Kayaku Co., Ltd.

The compound of Formula (B-8) is available as NC-7300L, trade name, from Nippon Kayaku Co., Ltd.

The compound of Formula (B-9) is available as NC-3500, trade name, from Nippon
Kayaku Co., Ltd.

The compound of Formula (B-10) is available as HP-7200L, trade name, from DIC Corporation.

The compound of Formula (B-11) is available as EHPE-3150, trade name, from Daicel Corporation.

The compound of Formula (B-12) is available as EPICLON HP-4700, trade name, from DIC Corporation.

The compound of Formula (B-13) is available as TEP-G, trade name, from ASAHI YUKIZAI CORPORATION.

The compound of Formula (B-14) is EPOLEAD GT401, trade name, available from Daicel Corporation. In Formula (B-14), a, b, c, and d are each 0 or 1, and a+b+c+d is 1.

The compound of Formula (B-15) is available as TEPIC-SS, trade name, from Nissan Chemical Industries, Ltd.

The compound of Formula (B-16) is available as EX-411, trade name, from Nagase ChemteX Corporation.

The compound of Formula (B-17) is available as EX-521, trade name, from Nagase ChemteX Corporation.

The compound of Formula (B-18) is available as YH-434L, trade name, from Nippon Steel & Sumikin Chemical Co., Ltd.

The compound of Formula (B-19) is available as EX-711, trade name, from Nagase ChemteX Corporation.

The compound of Formula (B-20) is available as YD-4032D, trade name, from DIC Corporation.

The compound of Formula (B-21) is available as HP-4770, trade name, from DIC Corporation.

The compound of Formula (B-22) is available as YH-434L, trade name, from Nippon Steel & Sumikin Chemical Co., Ltd.

The compound of Formula (B-23) is available as a reagent.

The compound of Formula (B-24) is available as RE-810NM, trade name, from Nippon Kayaku Co., Ltd.

The compound of Formula (B-25) is available as FAE-2500, trade name, from Nippon Kayaku Co., Ltd.

The compound of Formula (B-26) is available as NC-6000, trade name, from Nippon Kayaku Co., Ltd.

Further, EPICLON HP-6000 (epoxy value: 244 g/eq.), trade name, available from DIC Corporation may be used.

Examples of the epoxy compound (C) having an unsaturated bond between carbon atoms used in the present invention are as follows.

Formula (C-1)

Formula (C-2)

Formula (C-3)

The compound of Formula (C-1) is available as MA-DGIC, trade name, from Shikoku Chemicals Corporation.

The compound of Formula (C-3) is available as DA-MGIC, trade name, from Shikoku Chemicals Corporation.

The compound other than the aforementioned compounds is available as a reagent.

Examples of the proton-generating compound (D) used in the present invention are as follows.

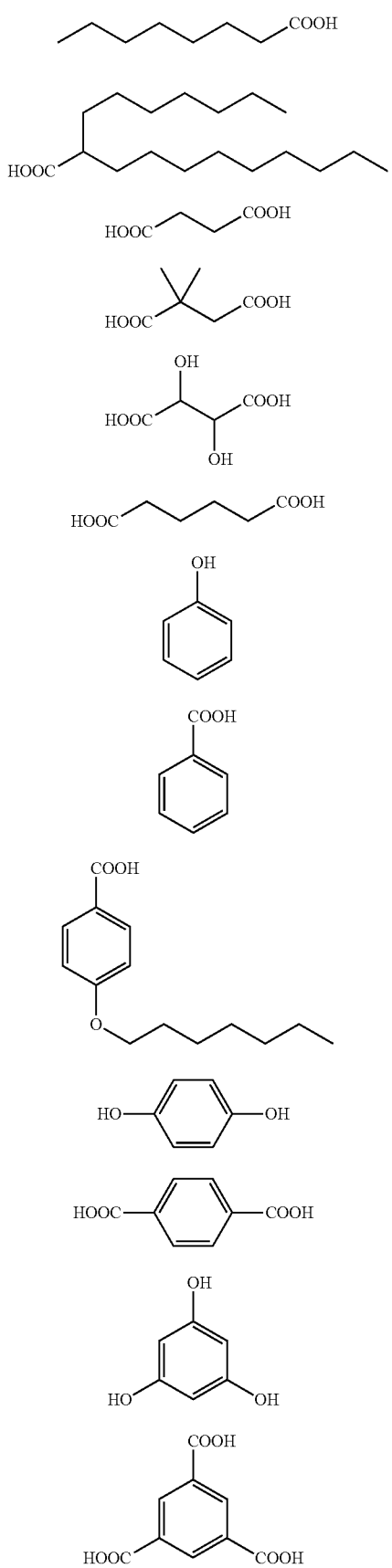
Formula (D-1)
Formula (D-2)
Formula (D-3)
Formula (D-4)
Formula (D-5)
Formula (D-6)
Formula (D-7)
Formula (D-8)
Formula (D-9)
Formula (D-10)
Formula (D-11)
Formula (D-12)
Formula (D-13)
-continued
Formula (D-14)
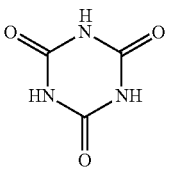
Formula (D-15)
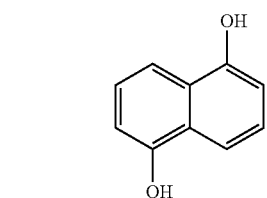
Formula (D-16)
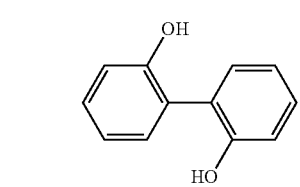
Formula (D-17)
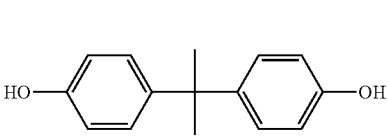
Formula (D-18)
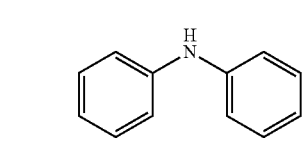
Formula (D-19)
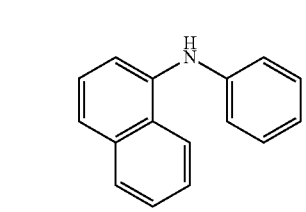
Formula (D-20)
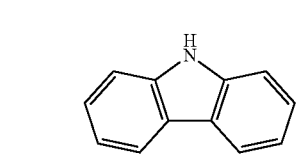
Formula (D-21)
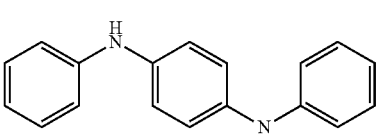
Formula (D-22)
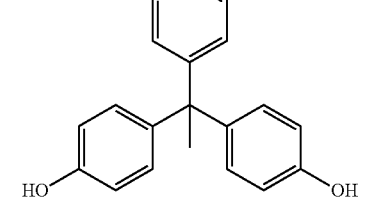

Formula (D-23)
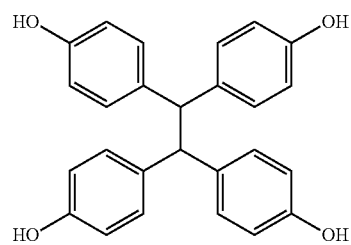
Formula (D-24)
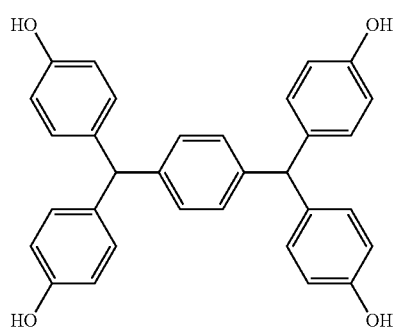
Formula (D-25)
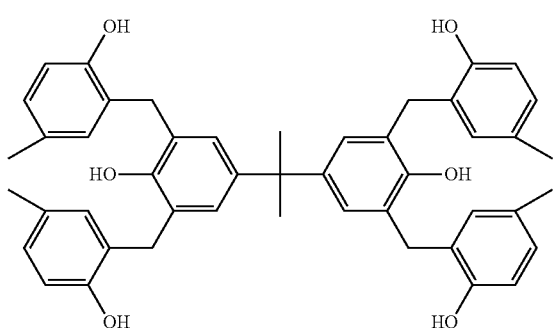
Formula (D-26)
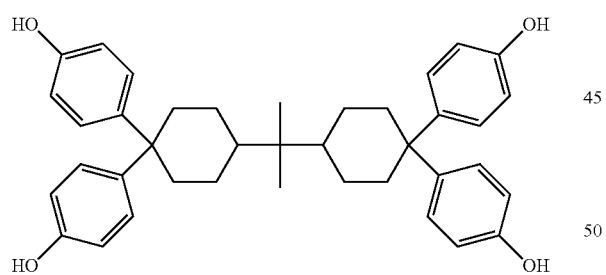
Formula (D-27)
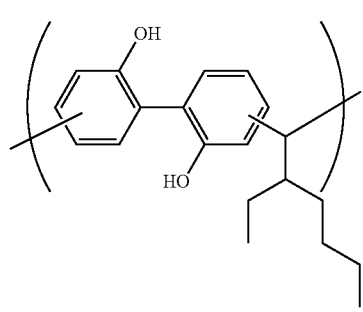
Formula (D-28)
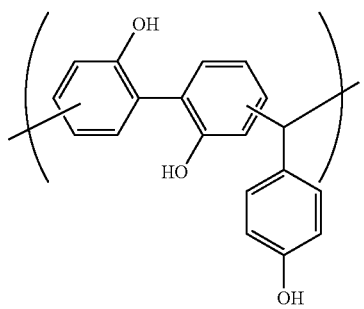
Formula (D-29)
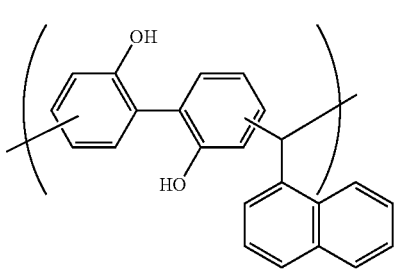
Formula (D-30)
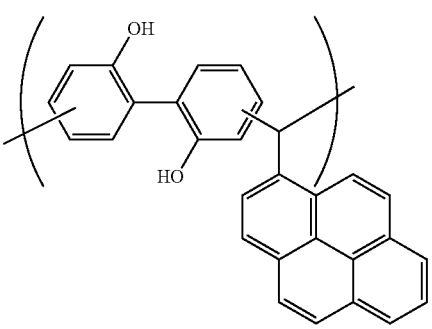
Formula (D-31)
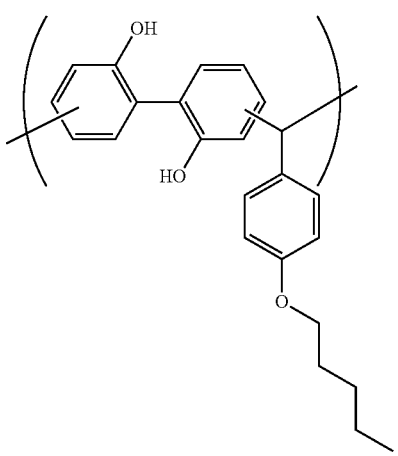

Formula (D-32)
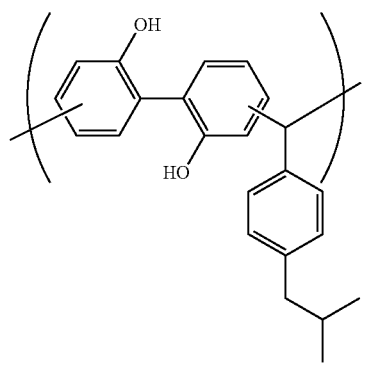

Formula (D-33)
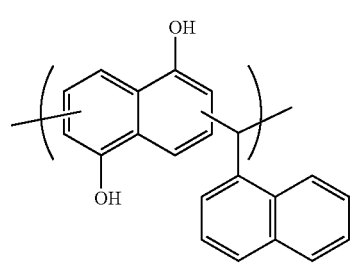

Formula (D-34)
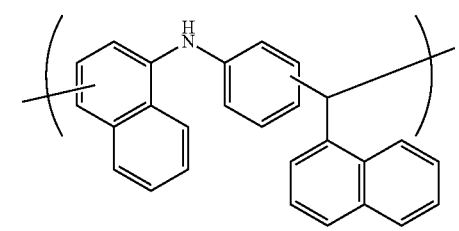

Formula (D-35)
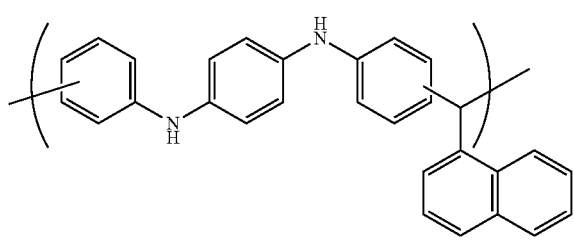

Formula (D-36)
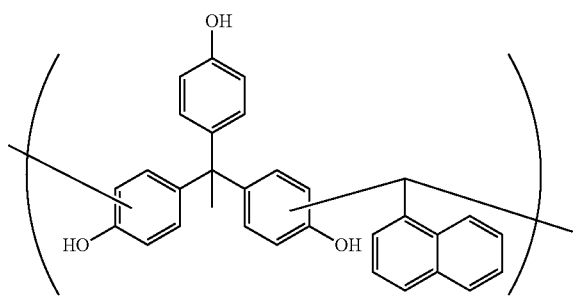

Formula (D-37)
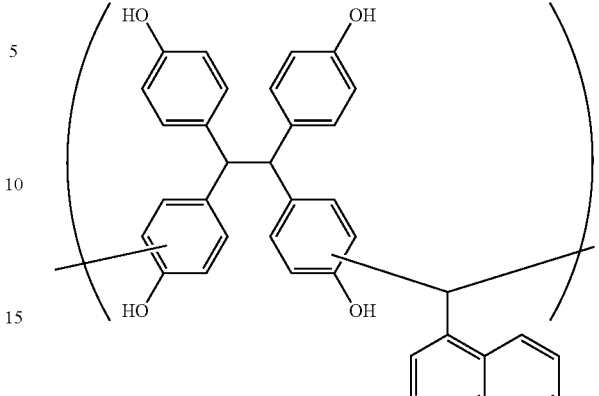

Formula (D-38)
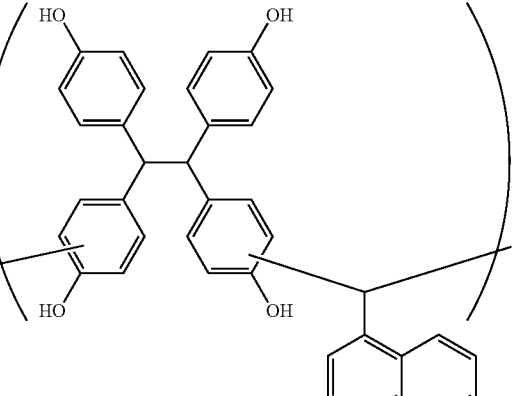

The compounds are available as a reagent.

The compound of Formula (D-23) is available as TEP-DF, trade name, from ASAHI YUKIZAI CORPORATION.

The compound of Formula (D-24) is available as TEP-TPA, trade name, from ASAHI YUKIZAI CORPORATION.

The compound of Formula (D-25) is available as TEPC-BIP-A, trade name, from ASAHI YUKIZAI CORPORATION.

The compound of Formula (D-26) is available as TEP-BOCP, trade name, from ASAHI YUKIZAI CORPORATION.

In the present invention, the compound (E) has a hydroxy group of the partial structure (II). A part of the hydroxy group may be reacted with the compound (G) having an unsaturated bond between carbon atoms and capable of being reacted with the hydroxy group. Photoreactivity is improved by a reaction of the compound (G). Even after this reaction, it is desirable that in the compound (E), the molar ratio (partial structure (II))/(partial structure (I)+partial structure (II)) fall within a range of 0.01 or more and 0.8 or less.

The compound (G) may be an acid halide, an acid anhydride, an isocyanate compound, or a halogenated alkyl compound that has an unsaturated bond between carbon atoms, or the proton-generating compound (A) having an unsaturated bond between carbon atoms.

Examples of the compound (G) are as follows.

Formula (G-1)
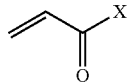

Formula (G-2)
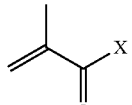

Formula (G-3)
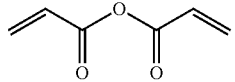

Formula (G-4)

Formula (G-5)

Formula (G-6)

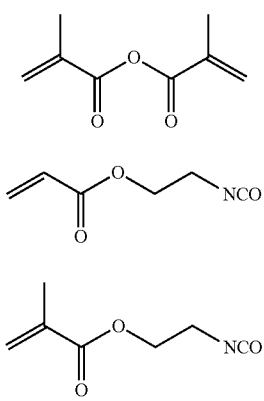

Formula (G-7)

Formula (G-8)

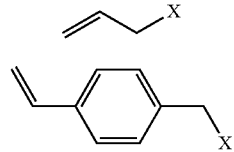

In Formulae described above, X is a halogen atom such as a fluorine atom, a chlorine atom, a bromine atom, or an iodine atom. For example, X in Formula (G-1) is preferably a chlorine atom, X in Formula (G-2) is preferably a chlorine atom, X in Formula (G-7) is preferably a bromine atom, and X in Formula (G-8) is preferably a chlorine atom. The aforementioned compounds are available as a reagent.

Examples of the compound (E) used in the present invention are as follows.

Formula (E-1)

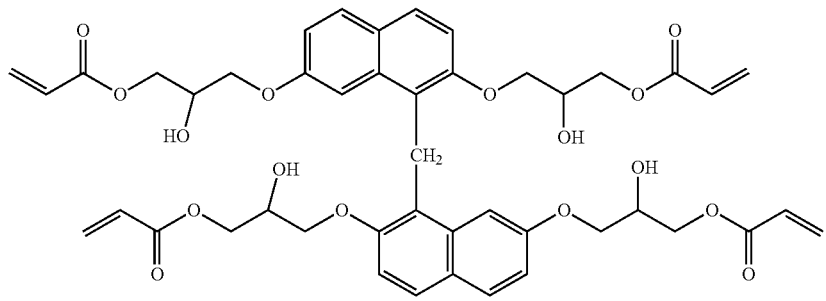

Formula (E-2)

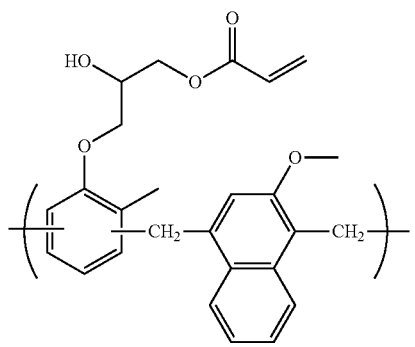

Formula (E-3)

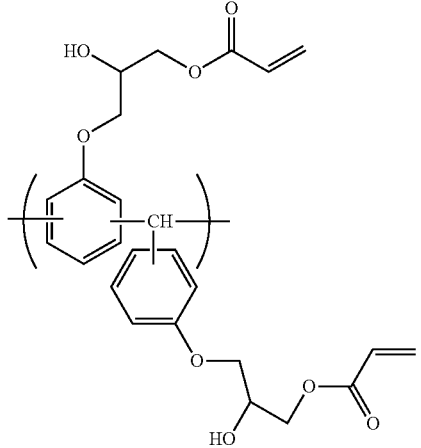

-continued
Formula (E-4)
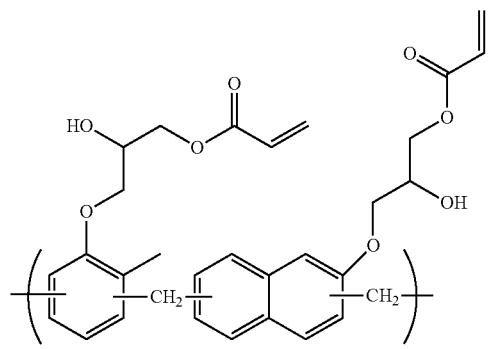
Formula (E-5)
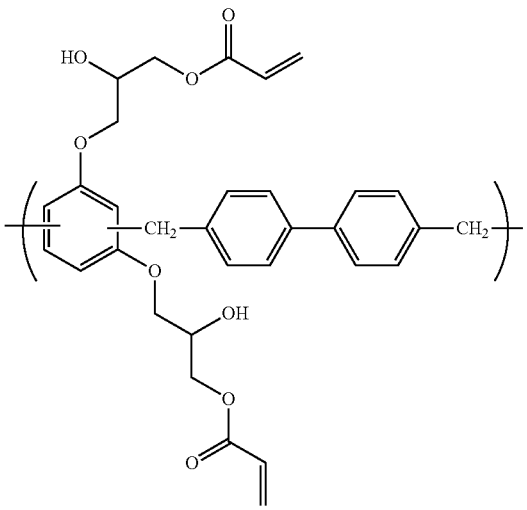
Formula (E-6)
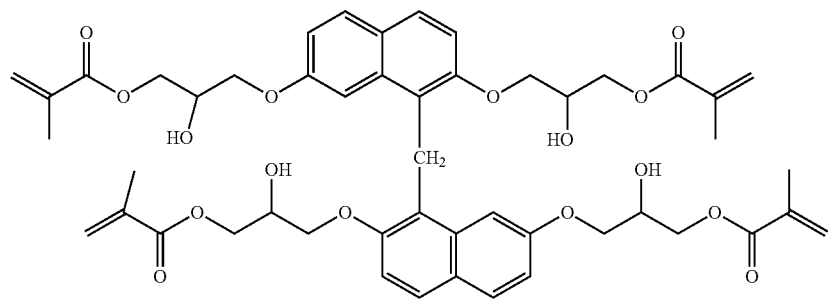
Formula (E-7)
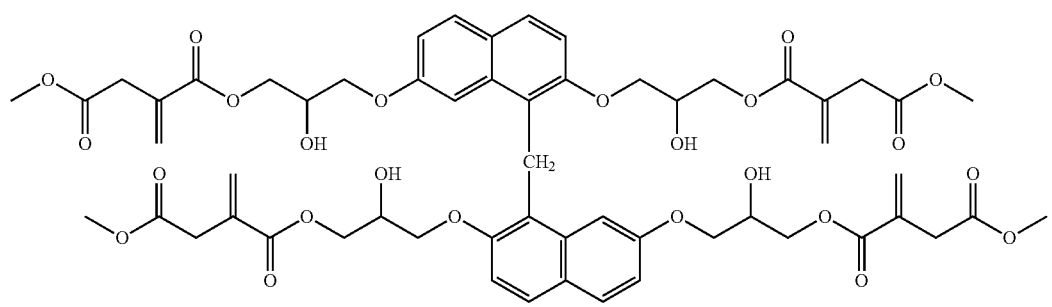
Formula (E-8)
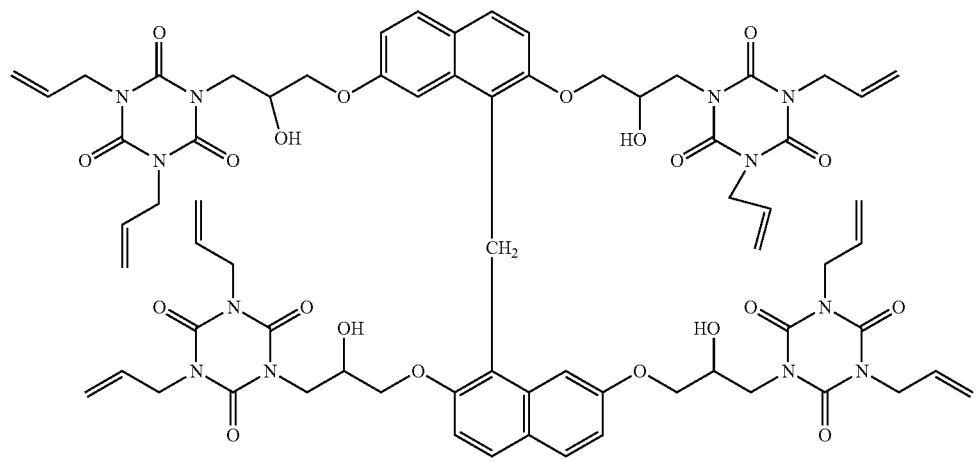

Formula (E-9)
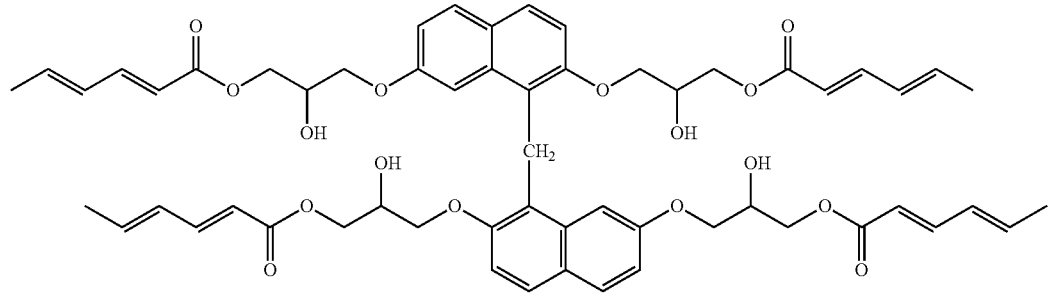
Formula (E-10)
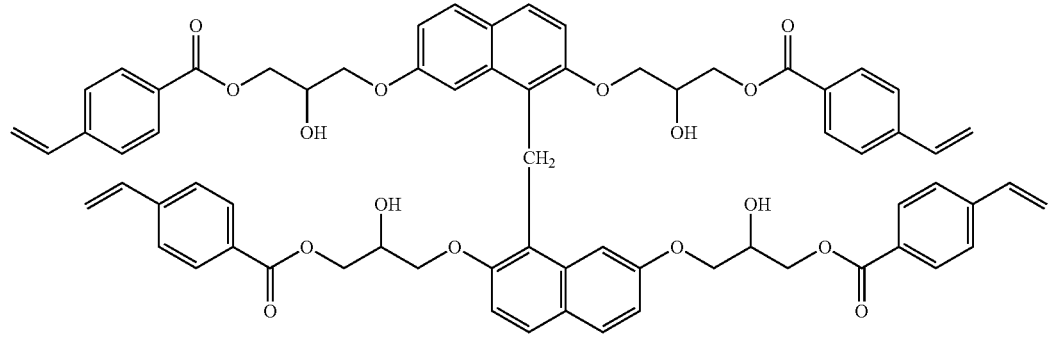
Formula (E-11)
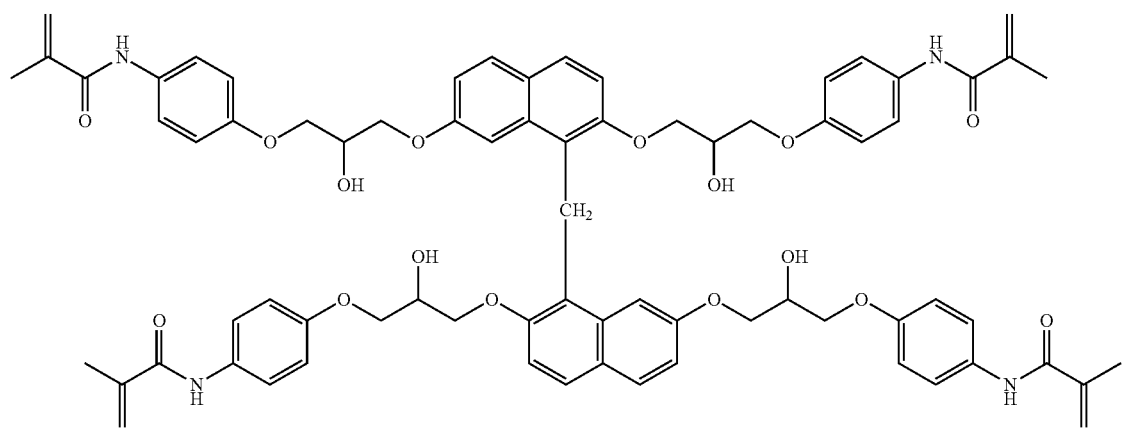
Formula (E-12)
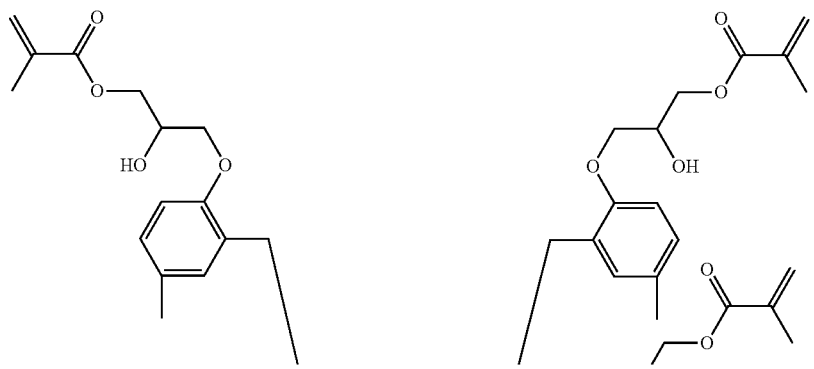

-continued
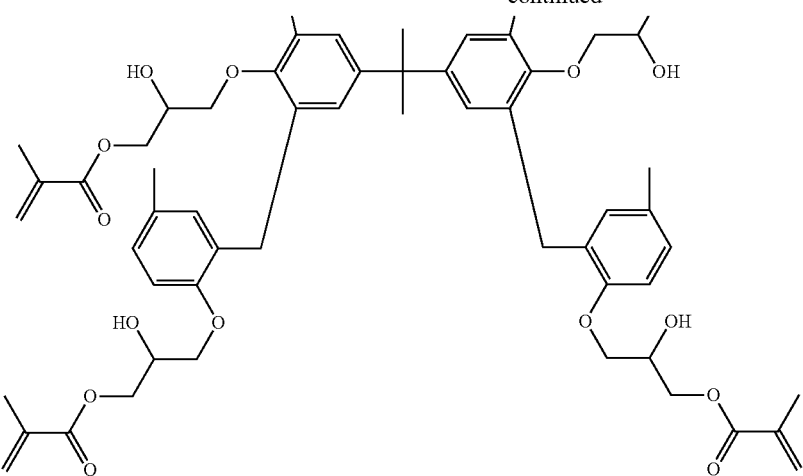
Formula (E-13)
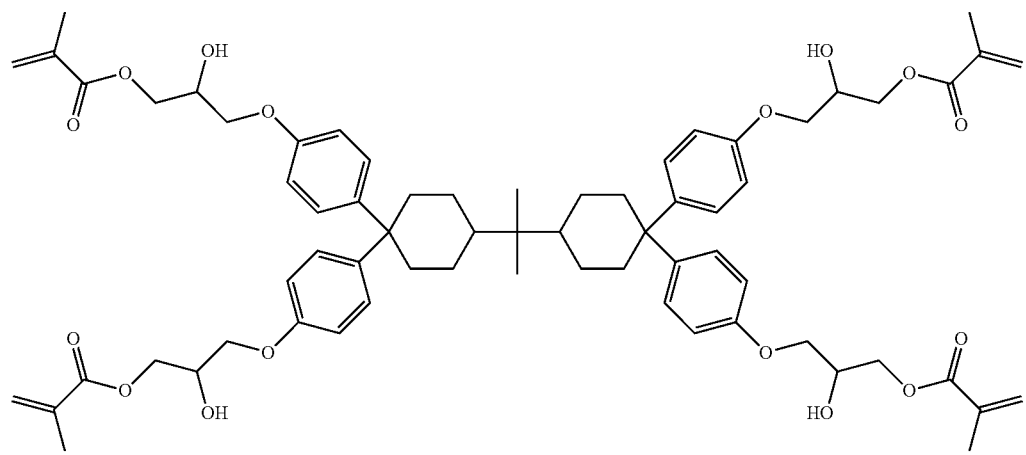
Formula (E-14)
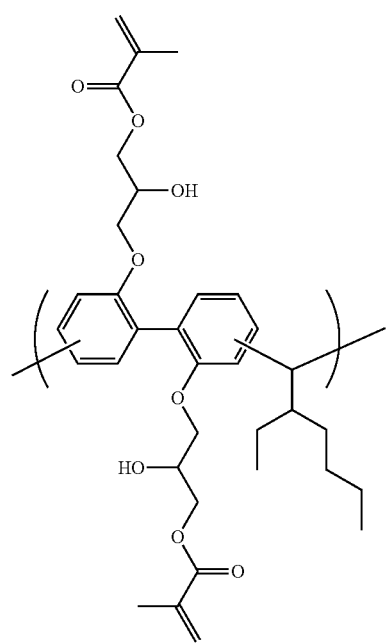
Formula (E-15)
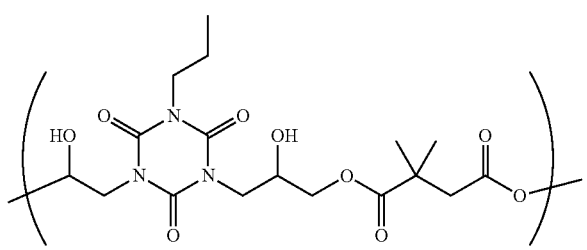

Formula (E-16)
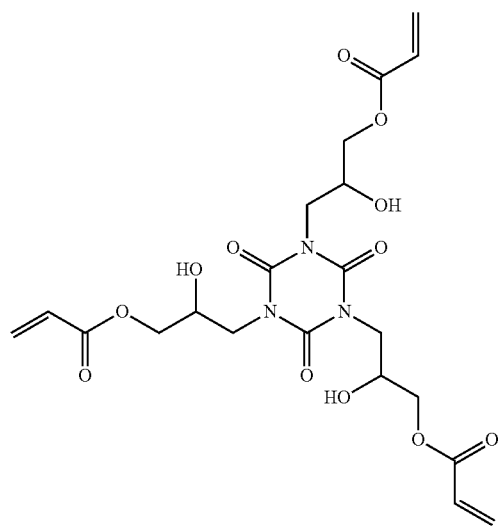
Formula (E-17)
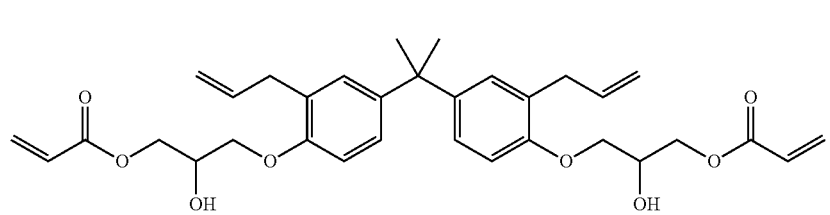
Formula (E-18)
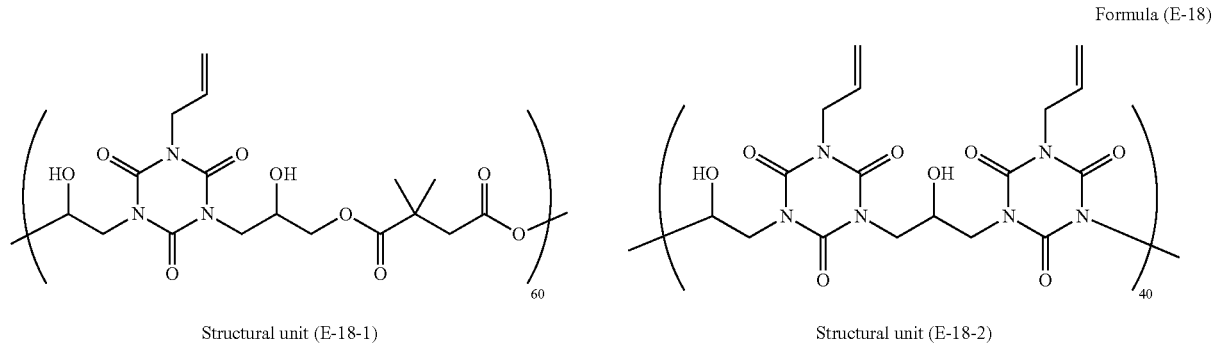
In Formula (E-18), the molar ratio of a unit structure (E-18-1) to a unit structure (E-18-2) is 60:40.
Formula (E-19)
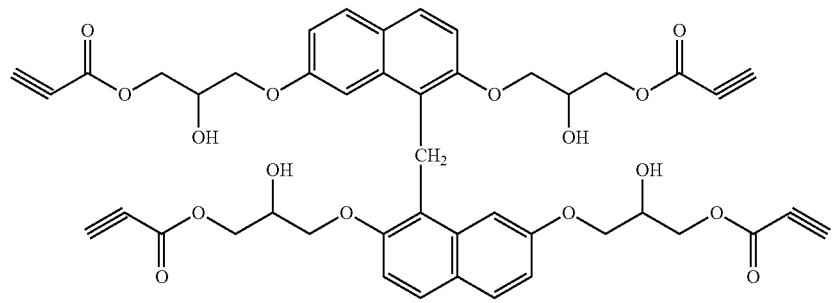

Formula (E-20)

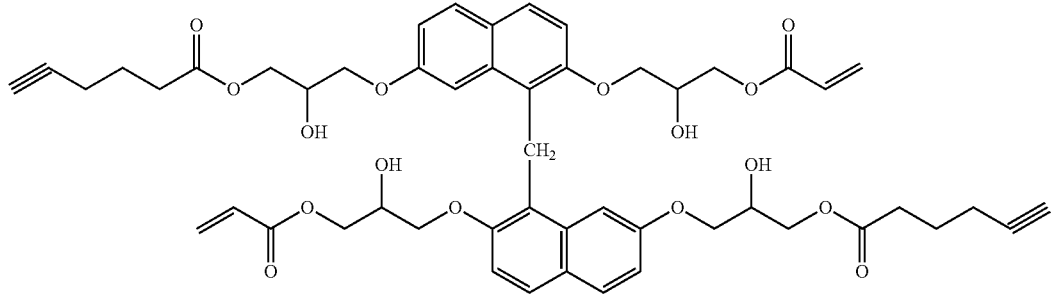

Formula (E-21)

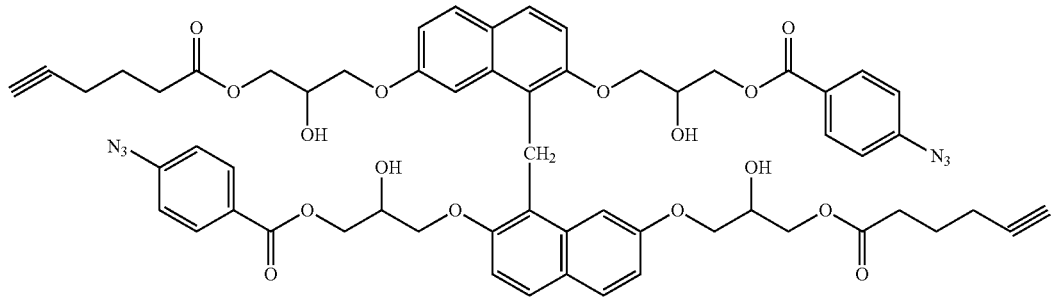

Formula (E-22)

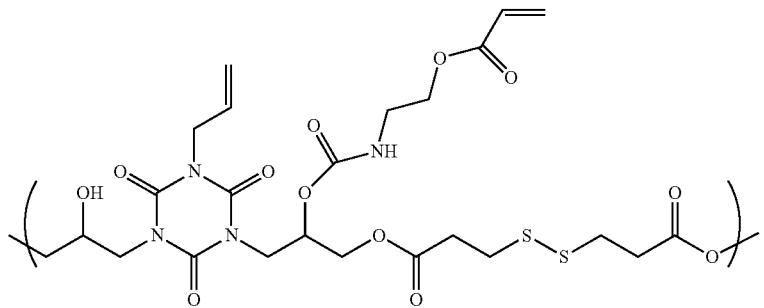

Formula (E-23)

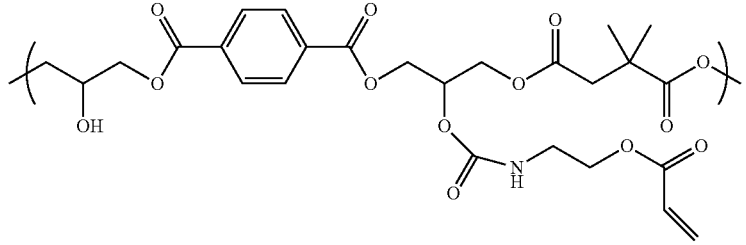

Examples of the crosslinkable compound (H) used in the present invention include a melamine-based compound or a substituted urea compound that has an alkoxymethyl group, or a polymer thereof. Examples of the alkoxy group include $C_{1-10}$ alkoxy groups such as methoxy group, ethoxy group, propoxy group, and butoxy group. Examples of a methyl group having the alkoxy group include methoxymethyl group, ethoxymethyl group, propoxymethyl group, and butoxymethyl group. The compound (H) is preferably a crosslinker having at least two crosslinking-forming substituents described above, which is a compound such as methoxymethylated glycoluril, butoxymethylated glycoluril, methoxymethylated melamine, butoxymethylated melamine, methoxymethylated benzoguanamine, butoxymethylated benzoguanamine, methoxymethylated urea, butoxymethylated urea, methoxymethylated thiourea, or butoxymethylated thiourea. A condensate of the compounds may also be used.

As the crosslinker, a crosslinker having high heat resistance can be used. As the crosslinker having high heat resistance, a compound having a crosslinking-forming substituent having an aromatic ring (e.g., benzene ring and naphthalene ring) in the molecule can be used.

Examples of this compound include a compound having a partial structure of the following Formula (H-1), and a polymer and an oligomer having a repeating unit of the following Formula (H-2).

Formula (H-1)

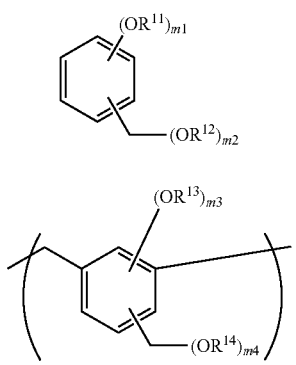

Formula (H-2)

$R^{11}$, $R^{12}$, $R^{13}$, and $R^{14}$ are a hydrogen atom or a $C_{1-10}$ alkyl group. As the alkyl group, the aforementioned examples can be used.

m1 is 1 or more and 6-m2 or less, m2 is 1 or more and 5 or less, m3 is 1 or more and 4-m2 or less, and m4 is 1 or more and 3 or less.

Examples of the compound, polymer, and oligomer involved with Formulae (H-1) and (H-2) are as follows.

Formula (H-1-1)

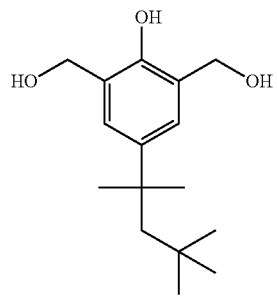

Formula (H-1-2)

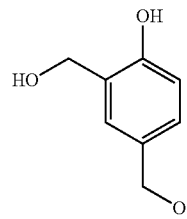

Formula (H-1-3)

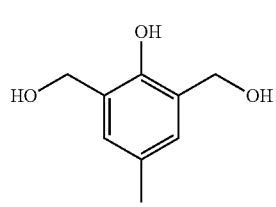

Formula (H-1-4)

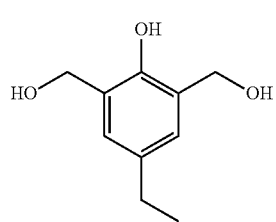

Formula (H-1-5)

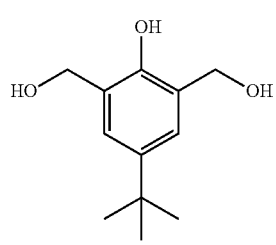

Formula (H-1-6)

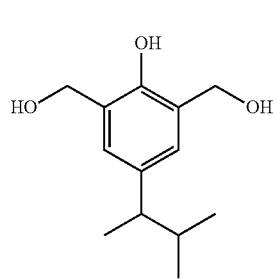

Formula (H-1-7)

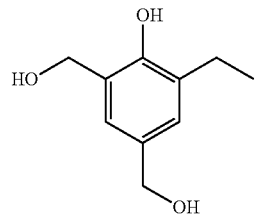

Formula (H-1-8)

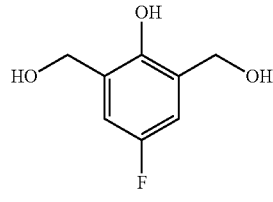

Formula (H-1-9)

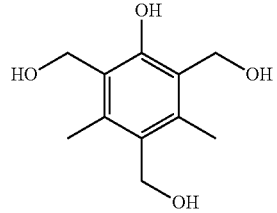

Formula (H-1-10)

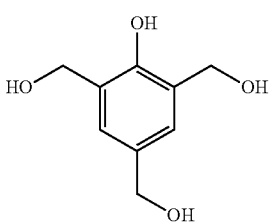

Formula (H-1-11)

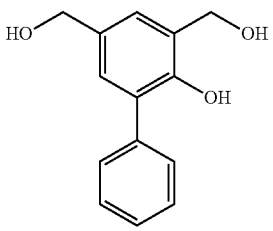

Formula (H-1-12)
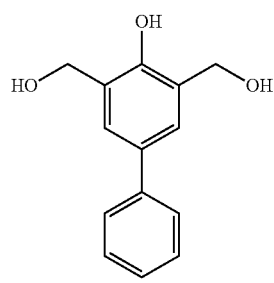
Formula (H-1-13)
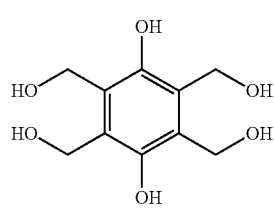
Formula (H-1-14)
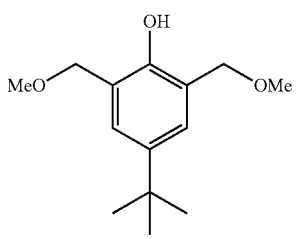
Formula (H-1-15)
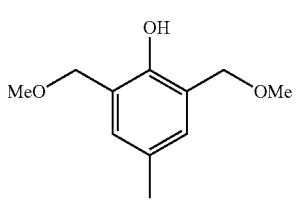
Formula (H-1-16)
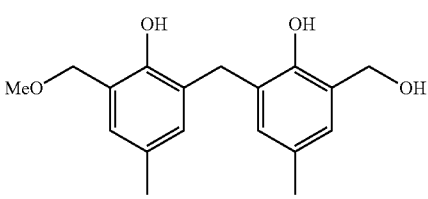
Formula (H-1-17)
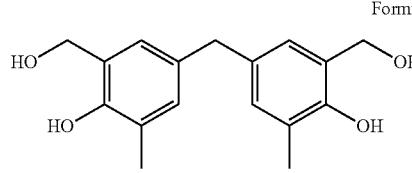
Formula (H-1-18)
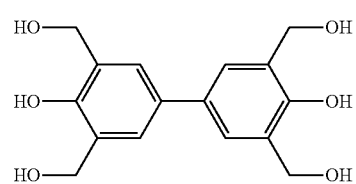
Formula (H-1-19)
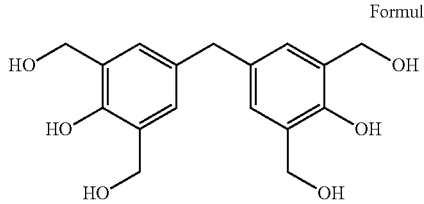
Formula (H-1-20)
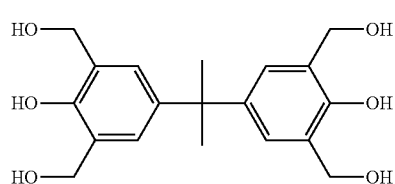
Formula (H-1-21)
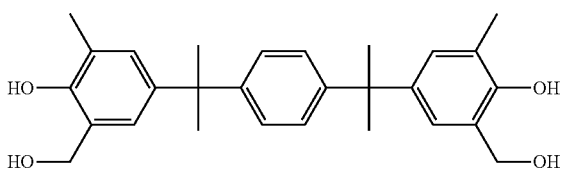
Formula (H-1-22)
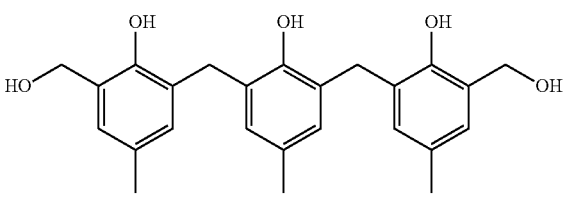
Formula (H-1-23)
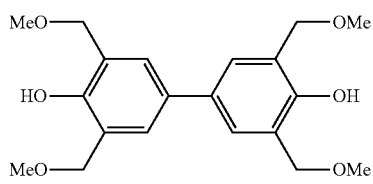
Formula (H-1-24)
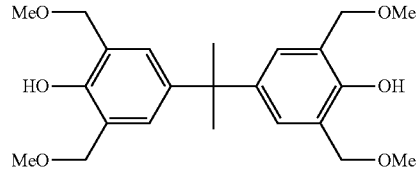
Formula (H-1-25)
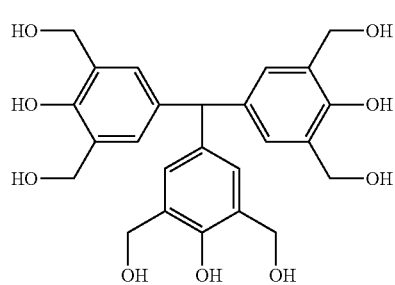

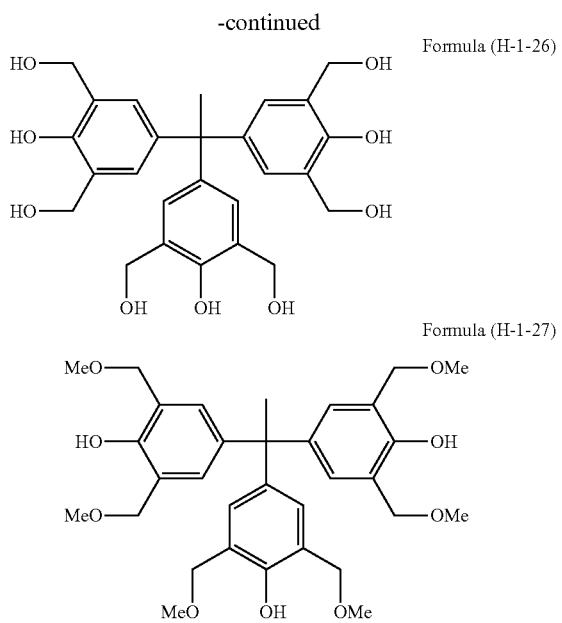

Formula (H-1-26)

Formula (H-1-27)

The aforementioned compounds are available as products from ASAHI YUKIZAI CORPORATION and Honshu Chemical Industry Co., Ltd. Among the crosslinkers, for example, the compound of Formula (H-1-23) is available as TMOM-BP, trade name, from Honshu Chemical Industry Co., Ltd. The compound of Formula (H-1-24) is available as TM-BIP-A, trade name, from ASAHI YUKIZAI CORPORATION.

The amount of the crosslinkable compound (H) to be added varies depending on a coating solvent to be used, an underlying substrate to be used, a solution viscosity to be required, and a film form to be required. The amount is 0.001 to 80% by mass, preferably 0.01 to 50% by mass, and further preferably 0.05 to 40% by mass, relative to the total solid content. The crosslinker may cause a crosslinking reaction due to self-condensation. However, when the aforementioned polymer of the present invention has a crosslinkable substituent, the crosslinker may cause a crosslinking reaction with the crosslinkable substituent.

In the present invention, as a catalyst for promoting the crosslinking reaction, an acid and/or an acid generator may be added. For example, an acidic compound such as p-toluenesulfonic acid, trifluoromethanesulfonic acid, pyridinium p-toluenesulfonate, salicylic acid, 5-sulfosalicylic acid, 4-phenolsulfonic acid, camphorsulfonic acid, 4-chlorobenzenesulfonic acid, benzenedisulfonic acid, 1-naphthalenesulfonic acid, citric acid, benzoic acid, hydroxybenzoic acid, or naphthalenecarboxylic acid, and/or a thermal acid generator such as 2,4,4,6-tetrabromocyclohexadienone, benzoin tosylate, 2-nitrobenzyl tosylate, or another organic alkyl sulfonate can be mixed. The amount of the catalyst to be mixed is 0.0001 to 20% by mass, preferably 0.0005 to 10% by mass, and more preferably 0.01 to 3% by mass, relative to the total solid content.

In order to make the acidity of the resist underlayer film-forming composition for lithography of the present invention identical to the acidity of a photoresist formed as an upper layer in a lithography process, a photoacid generator may be added. Preferable examples of the photoacid generator include onium salt-based photoacid generators such as bis(4-t-butylphenyl)iodonium trifluoromethanesulfonate and triphenylsulfonium trifluoromethanesulfonate, halogen-containing compound-based photoacid generators such as phenyl-bis(trichloromethyl)-s-triazine, and sulfonic acid-based photoacid generators such as benzoin tosylate and N-hydroxysuccinimide trifluoromethanesulfonate. The amount of the photoacid generator is 0.2 to 10% by mass, and preferably 0.4 to 5% by mass, relative to the total solid content.

The stepped substrate-coating composition of the present invention may contain a surfactant. Examples of the surfactant include nonionic surfactants including polyoxyethylene alkyl ethers such as polyoxyethylene lauryl ether, polyoxyethylene stearyl ether, polyoxyethylene cetyl ether, and polyoxyethylene oleyl ether, polyoxyethylene alkylaryl ethers such as polyoxyethylene octylphenyl ether and polyoxyethylene nonylphenyl ether, polyoxyethylene-polyoxypropylene block copolymers, sorbitan fatty acid esters such as sorbitan monolaurate, sorbitan monopalmitate, sorbitan monostearate, sorbitan monooleate, sorbitan trioleate, and sorbitan tristearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate, fluorosurfactants including Eftop [registered trademark] EF301, EF303, and EF352 (available from Mitsubishi Materials Electronic Chemicals Co., Ltd.), MEGAFACE [registered trademark] F171, F173, R30, R-30N, R-40, and R-40LM (available from DIC Corporation), Fluorad FC430 and FC431 (available from Sumitomo 3M, Ltd.), and Asahi Guard [registered trademark] AG710, and Surflon [registered trademark] S-382, SC101, SC102, SC103, SC104, SC105, and SC106 (available from Asahi Glass Co., Ltd.), and organosiloxane polymer KP341 (available from Shin-Etsu Chemical Co., Ltd.). One type selected from the surfactants may be added, or two or more types thereof may be added in combination. The content of the surfactant is, for example, 0.01% by mass to 5% by mass relative to the solid content of the stepped substrate-coating composition of the present invention except for a solvent described blow.

As a solvent capable of dissolving the compound (E) in the present invention, ethylene glycol monomethyl ether, ethylene glycol monoethyl ether, ethylene glycol monobutyl ether, ethylene glycol monoisopropyl ether, ethylene glycol methyl ether acetate, ethylene glycol ethyl ether acetate, methyl cellosolve acetate, ethyl cellosolve acetate, diethylene glycol, diethylene glycol monomethyl ether, diethylene glycol monoethyl ether, diethylene glycol dimethyl ether, diethylene glycol diethyl ether, diethylene glycol monoethyl ether acetate, propylene glycol, propylene glycol monomethyl ether, propylene glycol monobutyl ether, propylene glycol monomethyl ether acetate, propylene glycol monoethyl ether, propylene glycol monoethyl ether acetate, propylene glycol propyl ether acetate, dipropylene glycol monomethyl ether, dipropylene glycol monoethyl ether, triethylene glycol dimethyl ether, toluene, xylene, styrene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, 1-octanol, ethylene glycol, hexylene glycol, trimethylene glycol, 1-methoxy-2-butanol, cyclohexanol, diacetone alcohol, furfuryl alcohol, tetrahydrofurfuryl alcohol, propylene glycol, benzyl alcohol, 1,3-butanediol, 1,4-butanediol, 2,3-butanediol, γ-butyrolactone, acetone, methyl isopropyl ketone, diethyl ketone, methyl isobutyl ketone, methyl n-butyl ketone, isopropyl acetate ketone, n-propyl acetate, isobutyl acetate, methanol, ethanol, isopropanol, tert-butanol, allyl alcohol, n-propanol, 2-methyl-2-butanol, isobutanol, n-butanol, 2-methyl-1-butanol, 1-pentanol, 2-methyl-1-pentanol, 2-ethyl hexanol, isopropyl ether, 1,4-dioxane, N,N-dimethyl paternmuamide, N,N-dimethylacetamide, N-methylpyrrolidone, 1,3-dimethyl-2-imidazolidinone, dimethylsulfoxide, or N-cyclohexyl-2-pyrrolidinone or the like may be used. The organic solvent is used alone, or two or more types thereof are used in combination.

Next, a method for forming a flattened film using the stepped substrate-coating composition of the present invention will be described. The stepped substrate-coating composition is applied to a substrate used in manufacturing of a precision integrated circuit element (e.g., a transparent substrate such as a silicon/silicon dioxide coating, a glass substrate, or an ITO substrate) by an appropriate coating method such as a spinner or a coater, baked (heated), and exposed to form a coating film. That is, a coated substrate is manufactured by steps of (i) applying the stepped substrate-coating composition to a stepped substrate, and (ii) exposing the composition.

Using a spinner for application, for example, the stepped substrate-coating composition can be applied at a rotation number of 100 to 5,000 for 10 to 180 seconds.

As the substrate, a substrate having an open area (unpatterned area) and dense (DENCE) and coarse (ISO) pattern areas with an aspect ratio of patterns of 0.1 to 10 can be used.

The unpatterned area is a portion where no pattern (e.g., a hole or a trench structure) exist on the substrate. The dense (DENCE) pattern area is a portion where patterns are dense on the substrate, and the coarse (ISO) pattern area is a portion where patterns are scattered at wide intervals on the substrate. The aspect ratio of patterns is the ratio of the depth of the patterns to the width of the patterns. The pattern depth is usually several hundreds of nm (e.g., approximately 100 to 300 nm). The dense (DENCE) pattern area is a portion where patterns with approximately several tens of nm (e.g., 30 to 80 nm) are densely disposed at intervals of approximately 100 nm. The coarse (ISO) pattern area is a portion where patterns with several hundreds of nm (e.g., approximately 200 to 1,000 nm) are scattered.

Herein, the thickness of a stepped substrate-coating film (flattened film) is preferably 0.01 to 3.0 μm. In a step (ia), heating can be performed after the application, and the condition of the heating is 70 to 400° C. or 100 to 250° C. for 10 seconds to 5 minutes or 30 seconds to 2 minutes. This heating allows the stepped substrate-coating composition to reflow to form a flat stepped substrate-coating film (flattened film).

The exposure light in the step (ii) is actinic light such as near ultraviolet light, far ultraviolet light, or extreme ultraviolet light (e.g., EUV, wavelength: 13.5 nm). For example, light having a wavelength of 248 nm (KrF laser beam), 193 nm (ArF laser beam), 172 nm (xenon excimer beam), or 157 nm ($F_2$ laser beam) is used. Ultraviolet light having an exposure wavelength of 150 nm to 248 nm can be used, and ultraviolet light having a wavelength of 172 nm is preferably used.

By this exposure, the stepped substrate-coating film (flattened film) is subjected to crosslinking. The exposure dose in the step (ii) may be 10 mJ/cm$^2$ to 3,000 mJ/cm$^2$. When the exposure dose falls within this range, a photoreaction occurs, crosslinking is formed, and solvent resistance is obtained.

The stepped substrate-coating film (flattened film) thus formed desirably has a difference in level of coating (Bias) between the open area and the pattern area of zero. The stepped substrate-coating film can be flattened so that Bias falls within a range of 1 to 50 nm or 1 to 25 nm. Bias between the open area and the DENCE area is approximately 15 to 20 nm, and Bias between the open area and the ISO area is approximately 1 to 10 nm.

The stepped substrate-coating film (flattened film) obtained by the present invention is coated with a resist film, the resist film is subjected to exposure and development by lithography, to form a resist pattern, and the substrate can be processed in accordance with the resist pattern. In this case, the stepped substrate-coating film (flattened film) is a resist underlayer film, and the stepped substrate-coating composition is a resist underlayer film-forming composition.

A resist is applied to the resist underlayer film, irradiated with light or an electron beam using a predetermined mask, and subjected to development, rinsing, and drying. Thus, a favorable resist pattern can be obtained. After the irradiation with light or an electron beam, post exposure bake (PEB) can also be performed, if necessary. A portion of the resist underlayer film at which the resist film is removed by development in the aforementioned step can be removed by dry etching, to form a desired pattern on the substrate.

The resist used in the present invention is a photoresist or an electron beam resist.

As a photoresist applied to the upper part of the resist underlayer film for lithography in the present invention, any of a negative photoresist and a positive photoresist may be used. Examples thereof include a positive photoresist including a novolac resin and 1,2-naphthoquinonediazide sulfonic acid ester, a chemically amplified photoresist including a binder having a group that increases the alkali dissolution rate by decomposition with an acid, and a photoacid generator, a chemically amplified photoresist including an alkali-soluble binder, a low molecular weight compound that increases the alkali dissolution rate of the photoresist by decomposition with an acid, and a photoacid generator, a chemically amplified photoresist including a binder having a group that increases the alkali dissolution rate by decomposition with an acid, a low molecular weight compound that increases the alkali dissolution rate of the photoresist by decomposition with an acid, and a photoacid generator, and a photoresist having an Si atom in the skeleton thereof. Specific examples thereof include APEX-E, trade name, available from Rohm and Haas.

Examples of an electron beam resist applied to the upper part of the resist underlayer film for lithography in the present invention include a composition including a resin having an Si—Si bond in the main chain and an aromatic ring at the terminal and an acid generator that generates an acid by irradiation with an electron beam, or a composition including poly(p-hydroxystyrene) in which a hydroxyl group is substituted with an organic group containing N-carboxyamine and an acid generator that generates an acid by irradiation with an electron beam. In the latter electron beam resist composition, an acid generated from the acid generator by irradiation with an electron beam is reacted with a N-carboxyaminoxy group of the polymer side chain to decompose the polymer side chain into a hydroxyl group. Thus, the electron beam resist composition exhibits alkaline solubility. The electron beam resist composition is dissolved in an alkaline developer to form a resist pattern. Examples of the acid generator that generates an acid by irradiation with an electron beam include halogenated organic compounds such as 1,1-bis[p-chlorophenyl]-2,2,2-trichloroethane, 1,1-bis[p-methoxyphenyl]-2,2,2-trichloroethane, 1,1-bis[p-chlorophenyl]-2,2-dichloroethane, and 2-chloro-6-(trichloromethyl)pyridine, onium salts such as a triphenylsulfonium salt and a diphenyliodonium salt, and sulfonic acid esters such as nitrobenzyl tosylate and dinitrobenzyl tosylate.

The exposure light for the photoresist is actinic light such as near ultraviolet light, far ultraviolet light, or extreme ultraviolet light (e.g., EUV, wavelength: 13.5 nm). For example, light having a wavelength of 248 nm (KrF laser beam), 193 nm (ArF laser beam), or 157 nm ($F_2$ laser beam) is used. In the irradiation with light, any process can be used without particular restriction as long as it is a process capable of generating an acid from the photoacid generator in the resist film. The exposure dose is 1 to 3,000 mJ/cm$^2$, 10 to 3,000 mJ/cm$^2$, or 10 to 1,000 mJ/cm$^2$.

In the irradiation of the electron beam resist with an electron beam, for example, an electron beam irradiation device may be used.

As a developer for the resist film having the resist underlayer film formed from the resist underlayer film-forming composition for lithography of the present invention, an aqueous solution of an alkali including an inorganic alkali such as sodium hydroxide, potassium hydroxide, sodium carbonate, sodium silicate, sodium metasilicate, or ammonia water, a primary amine such as ethylamine or n-propylamine, a secondary amine such as diethylamine or di-n-butylamine, a tertiary amine such as triethylamine or methyldiethylamine, an alcoholamine such as dimethylethanolamine or triethanolamine, a quaternary ammonium salt such as tetramethylammonium hydroxide, tetraethylammonium hydroxide, or choline, or a cyclic amine such as pyrrole or piperidine can be used. The aqueous solution of the alkali, to which appropriate amounts of an alcohol such as isopropyl alcohol and a surfactant such as a nonionic surfactant are added, may also be used. Among the developers, a quaternary ammonium salt is preferable, and tetramethylammonium hydroxide and choline are further preferable.

As the developer, an organic solvent can be used. Examples of the organic solvent include methyl acetate, butyl acetate, ethyl acetate, isopropyl acetate, amyl acetate, isoamyl acetate, ethyl methoxyacetate, ethyl ethoxyacetate, propylene glycol monomethyl ether, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, 2-methoxybutyl acetate, 3-methoxybutyl acetate, 4-methoxybutyl acetate, 3-methyl-3-methoxybutyl acetate, 3-ethyl-3-methoxybutyl acetate, propylene glycol monomethyl ether acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxypropionate, ethyl 2-hydroxypropionate, methyl 3-methoxypropionate, ethyl 3-methoxypropionate, ethyl 3-ethoxypropionate, and propyl 3-methoxypropionate. Further, a surfactant or the like may be added to the developer. A condition for development is appropriately selected from a temperature of 5 to 50° C. and a time of 10 to 600 seconds.

In the present invention, a semiconductor device can be manufactured by steps of forming the resist underlayer film from the resist underlayer film-forming composition on a semiconductor substrate, forming a resist film on the resist underlayer film, forming a resist pattern by irradiation of the resist film with light or an electron beam and development, etching the resist underlayer film using the formed resist pattern, to form a patterned resist underlayer film, and processing the semiconductor substrate by using the patterned resist underlayer film.

When formation of finer resist pattern proceeds, a problem of resolution and a problem in which the resist pattern collapses after development occur. Therefore, a decrease in film thickness of the resist is desired. In this case, it is difficult to obtain a resist pattern film thickness sufficient for substrate processing. A process of imparting a function of a mask during substrate processing to not only the resist pattern but also a resist underlayer film to be formed between a resist film and a semiconductor substrate to be processed is required. As a resist underlayer film for such a process, being different from a conventional resist underlayer film having a high etching rate, a resist underlayer film for lithography having a selection ratio of dry etching rate close to that of the resist film, a resist underlayer film for lithography having a lower selection ratio of dry etching rate than that of the resist film, or a resist underlayer film for lithography having a lower selection ratio of dry etching rate than that of a semiconductor substrate are required. To such a resist underlayer film, an anti-reflective performance may be imparted, and the resist underlayer film may have a function of a conventional anti-reflective coating.

On the other hand, in order to obtain a finer resist pattern, a process in which the resist pattern and the resist underlayer film are made finer by dry etching of the resist underlayer film than the pattern width during development of resist has been started to be used. As the resist underlayer film for such a process, the resist underlayer film having a selection ratio of dry etching rate close to that of the resist film, which is different from the conventional anti-reflective coatings having high etching rate, is required. To such a resist underlayer film, an anti-reflective performance may be imparted, and the resist underlayer film may have a function of a conventional anti-reflective coating.

In the present invention, a resist may be applied directly to the resist underlayer film of the present invention after formation of the resist underlayer film on a substrate, or if necessary, one or more layers of coating material may be formed on the resist underlayer film and a resist may be applied to the layers. In this case, even when the resist film is thinly applied to prevent pattern collapse due to a decrease in pattern width of the resist film, the substrate can be processed by appropriate selection of etching gas.

Specifically, a semiconductor device can be manufactured by steps of forming the resist underlayer film from the resist underlayer film-forming composition on a semiconductor substrate, forming a hard mask from a coating material containing a silicon component or the like or a hard mask (e.g., silicon nitride oxide) by vapor deposition on the resist underlayer film, forming a resist film on the hard mask, forming a resist pattern by irradiation of the resist film with light or an electron beam and development, etching the hard mask using the formed resist pattern by a halogen-based gas to form the patterned hard mask, etching the resist underlayer film using the patterned hard mask by an oxygen-based gas or a hydrogen-based gas to form the patterned resist underlayer film, and processing the semiconductor substrate by using the patterned resist underlayer film by a halogen-based gas.

In consideration of effect of anti-reflective coating, the resist underlayer film-forming composition for lithography of the present invention does not diffuse a substance in the photoresist during heating and drying due to a light absorption moiety incorporated in the skeleton. The light absorption moiety has sufficiently high light absorption performance. Accordingly, the resist underlayer film-forming composition has high anti-reflective effect.

The resist underlayer film-forming composition for lithography of the present invention has high thermal stability, and can prevent pollution of a top layer due to a decomposed substance during baking, and impart a margin of temperature at a baking step.

Further, the resist underlayer film-forming composition for lithography of the present invention can be used for a film having a function of preventing reflection of light depending on a process condition, and a function of preventing an interaction between a substrate and a photoresist or an adverse influence on the substrate of a substance produced during exposure of a material used for the photoresist or the photoresist to light.

EXAMPLES

Synthesis Example 1

45.22 g of propylene glycol monomethyl ether was added to 9.00 g of epoxy group-containing benzene fused ring compound (trade name: EPICLON HP-4700, epoxy value: 162 g/eq., available from DIC Corporation, Formula (B-12)), 9.84 g of N-(4-hydroxyphenyl)methacrylamide, 1.04 g of ethyltriphenylphosphonium bromide, and 0.02 g of hydroquinone, and the mixture was heated and stirred under a nitrogen atmosphere at 100° C. for 25 hours. By adding 20 g of cation exchange resin (trade name: DOWEX [registered trademark] 550A, Muromachi Technos Co., Ltd.) and 20 g of anion exchange resin (trade name: AMBERLITE [registered trademark] 15JWET, ORGANO CORPORATION) to the obtained solution, an ion exchange treatment was performed at room temperature for 4 hours. The cation and anion exchange resins were separated to obtain a solution of compound (E). The obtained compound (E) corresponded to Formula (E-11), and the weight average molecular weight Mw measured by GPC in terms of polystyrene was 1,900. The compound (E) had no residual epoxy group, and the molar ratio (partial structure (II))/(partial structure (I)+partial structure (II)) was 0.5.

Synthesis Example 2

43.89 g of propylene glycol monomethyl ether was added to 14.00 g of epoxy group-containing benzene fused ring compound (trade name: EPICLON HP-6000, epoxy value: 239 g/eq., available from DIC Corporation), 4.24 g of acrylic acid, 0.54 g of ethyltriphenylphosphonium bromide, and 0.03 g of hydroquinone, and the mixture was heated and stirred under a nitrogen atmosphere at 100° C. for 22 hours. By adding 19 g of cation exchange resin (trade name: DOWEX (registered trademark) 550A, Muromachi Technos Co., Ltd.) and 19 g of anion exchange resin (trade name: amberlite (registered trademark) 15JWET, ORGANO CORPORATION) to the obtained solution, an ion exchange treatment was performed at room temperature for 4 hours. The cation and anion exchange resins were separated to obtain a solution of compound (E). The weight average molecular weight Mw measured by GPC in terms of polystyrene of the obtained compound was 800. The compound (E) had no residual epoxy group, and the molar ratio (partial structure (II))/(partial structure (I)+partial structure (II)) was 0.5.

Synthesis Example 3

44.77 g of propylene glycol monomethyl ether was added to 14.00 g of epoxy group-containing benzene fused ring compound (trade name: RE-810NM, epoxy value: 221 g/eq., available from Nippon Kayaku Co., Ltd., Formula (B-24)), 4.56 g of acrylic acid, 0.59 g of ethyltriphenylphosphonium bromide, and 0.03 g of hydroquinone, and the mixture was heated and stirred under a nitrogen atmosphere at 100° C. for 22 hours. By adding 19 g of cation exchange resin (trade name: DOWEX (registered trademark) 550A, Muromachi Technos Co., Ltd.) and 19 g of anion exchange resin (trade name: amberlite (registered trademark) 15JWET, ORGANO CORPORATION) to the obtained solution, an ion exchange treatment was performed at room temperature for 4 hours. The cation and anion exchange resins were separated to obtain a solution of compound (E). The obtained compound (E) corresponded to Formula (E-17), and the weight average molecular weight Mw measured by GPC in terms of polystyrene was 900. The compound (E) had no residual epoxy group, and the molar ratio (partial structure (II))/(partial structure (I)+partial structure (II)) was 0.5.

Comparative Synthesis Example 1

7.57 g of propylene glycol monomethyl ether and 17.67 g of propylene glycol monomethyl ether acetate were added to 5.00 g of epoxy group-containing aliphatic polyether (trade name: EHPE-3150, epoxy value: 179 g/eq., available from Daicel Corporation, Formula (B-11)), 3.11 g of 9-anthracenecarboxylic acid, 2.09 g of benzoic acid, and 0.62 g of ethyltriphenylphosphonium bromide, and the mixture was heated and refluxed under a nitrogen atmosphere for 13 hours. By adding 16 g of cation exchange resin (trade name: DOWEX (registered trademark) 550A, Muromachi Technos Co., Ltd.) and 16 g of anion exchange resin (trade name: amberlite (registered trademark) 15JWET, ORGANO CORPORATION) to the obtained solution, an ion exchange treatment was performed at room temperature for 4 hours. The cation and anion exchange resins were separated to obtain a solution of compound (J-1). The weight average molecular weight Mw measured by GPC in terms of polystyrene of the obtained compound (J-1) was 4,700.

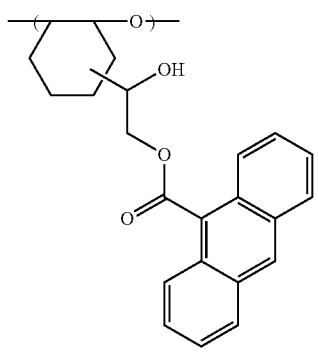

Formula (J-1)

-continued

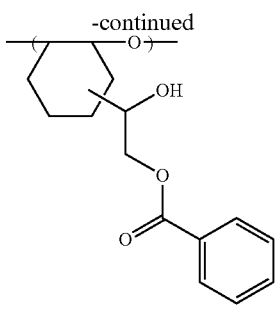

Production Example 1

To 4.87 g of the resin solution (solid content: 23.75% by mass) obtained in Synthesis Example 1, 0.23 g of tetramethoxymethyl glycoluril (trade name: POWDERLINK [registered trademark] 1174 available from Nihon Cytec Industries Inc.) as a thermal crosslinker, 0.01 g of pyridinium p-toluenesulfonate as a catalyst for a thermal crosslinking reaction, 0.001 g of surfactant (trade name: MEGAFACE [trade name] R-40 available from DIC Corporation, fluorosurfactant), 9.31 g of propylene glycol monomethyl ether, and 5.58 g of propylene glycol monomethyl ether acetate were added to prepare a solution of stepped substrate-coating composition.

Production Example 2

To 4.15 g of the resin solution (solid content: 23.75% by mass) obtained in Synthesis Example 1, 0.39 g of 3,3',5,5'-tetrakis(methoxymethyl)-4,4'-dihydroxybiphenyl (trade name: TMOM-BP available from Honshu Chemical Industry Co., Ltd.) as a thermal crosslinker, 0.02 g of K-PURE TAG-2689 (available from King Industries, Inc., thermal acid generator) as a catalyst for a thermal crosslinking reaction, 0.001 g of surfactant (trade name: MEGAFACE [trade name] R-40 available from DIC Corporation, fluorosurfactant), 9.86 g of propylene glycol monomethyl ether, and 5.58 g of propylene glycol monomethyl ether acetate were added to prepare a solution of stepped substrate-coating composition.

Production Example 3

To 4.83 g of the resin solution (solid content: 25.04% by mass) obtained in Synthesis Example 2, 0.18 g of tetramethoxymethyl glycoluril (trade name: POWDERLINK [registered trademark] 1174 available from Nihon Cytec Industries Inc.) as a thermal crosslinker, 0.01 g of pyridinium p-toluenesulfonate as a catalyst for a thermal crosslinking reaction, 0.001 g of surfactant (trade name: MEGAFACE [trade name] R-40 available from DIC Corporation, fluorosurfactant), 9.40 g of propylene glycol monomethyl ether, and 5.58 g of propylene glycol monomethyl ether acetate were added to prepare a solution of stepped substrate-coating composition.

Production Example 4

To 4.62 g of the resin solution (solid content: 25.04% by mass) obtained in Synthesis Example 2, 0.23 g of 3,3',5,5'-tetrakis(methoxymethyl)-4,4'-dihydroxybiphenyl (trade name: TMOM-BP available from Honshu Chemical Industry Co., Ltd.) as a thermal crosslinker, 0.01 g of K-PURE TAG-2689 (available from King Industries, Inc., thermal acid generator) as a catalyst for a thermal crosslinking reaction, 0.001 g of surfactant (trade name: MEGAFACE [trade name] R-40 available from DIC Corporation, fluorosurfactant), 9.56 g of propylene glycol monomethyl ether, and 5.58 g of propylene glycol monomethyl ether acetate were added to prepare a solution of stepped substrate-coating composition.

Production Example 5

To 5.30 g of the resin solution (solid content: 22.81% by mass) obtained in Synthesis Example 3, 0.18 g of tetramethoxymethyl glycoluril (trade name: POWDERLINK [registered trademark] 1174 available from Nihon Cytec Industries Inc.) as a thermal crosslinker, 0.01 g of pyridinium p-toluenesulfonate as a catalyst for a thermal crosslinking reaction, 0.001 g of surfactant (trade name: MEGAFACE [trade name] R-40 available from DIC Corporation, fluorosurfactant), 8.93 g of propylene glycol monomethyl ether, and 5.58 g of propylene glycol monomethyl ether acetate were added to prepare a solution of stepped substrate-coating composition.

Production Example 6

To 5.07 g of the resin solution (solid content: 22.81% by mass) obtained in Synthesis Example 3, 0.23 g of 3,3',5,5'-tetrakis(methoxymethyl)-4,4'-dihydroxybiphenyl (trade name: TMOM-BP available from Honshu Chemical Industry Co., Ltd.) as a thermal crosslinker, 0.01 g of K-PURE TAG-2689 (available from King Industries, Inc., thermal acid generator) as a catalyst for a thermal crosslinking reaction, 0.001 g of surfactant (trade name: MEGAFACE [trade name] R-40 available from DIC Corporation, fluorosurfactant), 9.11 g of propylene glycol monomethyl ether, and 5.58 g of propylene glycol monomethyl ether acetate were added to prepare a solution of stepped substrate-coating composition.

Production Example 7

To 2.53 g of the resin solution (solid content: 23.75% by mass) obtained in Synthesis Example 1 and 2.63 g of the resin solution (solid content: 22.81% by mass) obtained in Synthesis Example 3, 0.18 g of tetramethoxymethyl glycoluril (trade name: POWDERLINK [registered trademark] 1174 available from Nihon Cytec Industries Inc.) as a thermal crosslinker, 0.02 g of pyridinium p-toluenesulfonate as a catalyst for a thermal crosslinking reaction, 0.001 g of surfactant (trade name: MEGAFACE [trade name] R-40 available from DIC Corporation, fluorosurfactant), 9.06 g of propylene glycol monomethyl ether, and 5.58 g of propylene glycol monomethyl ether acetate were added to prepare a solution of stepped substrate-coating composition.

Production Example 8

To 2.41 g of the resin solution (solid content: 23.75% by mass) obtained in Synthesis Example 1 and 2.51 g of the resin solution (solid content: 22.81% by mass) obtained in Synthesis Example 3, 0.23 g of 3,3',5,5'-tetrakis(methoxymethyl)-4,4'-dihydroxybiphenyl (trade name: TMOM-BP available from Honshu Chemical Industry Co., Ltd.) as a thermal crosslinker, 0.02 g of K-PURE TAG-2689 (available from King Industries, Inc., thermal acid generator) as a catalyst for a thermal crosslinking reaction, 0.001 g of surfactant (trade name: MEGAFACE [trade name] R-40 available from DIC Corporation, fluorosurfactant), 9.24 g of propylene glycol monomethyl ether, and 5.58 g of propylene glycol monomethyl ether acetate were added to prepare a solution of stepped substrate-coating composition.

Comparative Production Example 1

To 5.89 g of the resin solution (solid content: 23.75% by mass) obtained in Synthesis Example 1, 0.001 g of surfactant (trade name: MEGAFACE [trade name] R-40 available from DIC Corporation, fluorosurfactant), 8.53 g of propylene glycol monomethyl ether, and 5.58 g of propylene glycol monomethyl ether acetate were added to prepare a solution of stepped substrate-coating composition.

Comparative Production Example 2

To 5.59 g of the resin solution (solid content: 23.75% by mass) obtained in Synthesis Example 2, 0.001 g of surfactant (trade name: MEGAFACE [trade name] R-40 available from DIC Corporation, fluorosurfactant), 8.83 g of propylene glycol monomethyl ether, and 5.58 g of propylene glycol monomethyl ether acetate were added to prepare a solution of stepped substrate-coating composition.

Comparative Production Example 3

To 2.94 g of the resin solution (solid content: 23.75% by mass) obtained in Synthesis Example 1 and 3.07 g of the resin solution (solid content: 22.81% by mass) obtained in Synthesis Example 3, 0.001 g of surfactant (trade name: MEGAFACE [trade name] R-40 available from DIC Corporation, fluorosurfactant), 8.41 g of propylene glycol monomethyl ether, and 5.58 g of propylene glycol monomethyl ether acetate were added to prepare a solution of stepped substrate-coating composition.

Comparative Production Example 4

To 5.15 g of the resin solution (solid content: 23.17% by mass) obtained in Comparative Synthesis Example 1, 0.30 g of tetramethoxymethyl glycoluril (trade name: POWDERLINK [registered trademark] 1174 available from Nihon Cytec Industries Inc.) as a thermal crosslinker, 0.01 g of pyridinium p-toluenesulfonate as a catalyst for a thermal crosslinking reaction, 0.001 g of surfactant (trade name: MEGAFACE [trade name] R-40 available from DIC Corporation, fluorosurfactant), 11.76 g of propylene glycol monomethyl ether, and 2.78 g of propylene glycol monomethyl ether acetate were added to prepare a solution of stepped substrate-coating composition.

[Test of Thermosetting Property]

In Examples 1 to 8, the stepped substrate-coating compositions prepared in Production Examples 1 to 8, respectively, were each applied to a silicon wafer using a spin coater (spin coating). In Comparative Examples 1 to 4, the stepped substrate-coating compositions prepared in Comparative Production Examples 1 to 4, respectively, were each applied to a silicon wafer using a spin coater (spin coating). Subsequently, each of the compositions was heated on a hot plate at 170° C. for 1 minute to form a coating film having a thickness of 200 nm. The stepped substrate-coating films were each immersed in a mixed solvent of propylene glycol monomethyl ether and propylene glycol monomethyl ether acetate at a ratio of 7:3 for 1 minute, spin-dried, and then heated at 100° C. for 30 seconds. The film thickness of the stepped substrate-coating films before and after immersion in the mixed solvent was measured with an optical interference thickness meter. The results of solvent resistance test are shown in Table 1. In Table 1, the initial thickness shows the film thickness before a test of solvent separation.

TABLE 1

| Examples | Initial film thickness (nm) | Film thickness after separation (nm) | Solvent resistance |
|---|---|---|---|
| Example 1 | 205.1 | 113.5 | Not developed |
| Example 2 | 197.7 | 136.1 | Not developed |
| Example 3 | 200.3 | 165.5 | Not developed |
| Example 4 | 199.2 | 165.4 | Not developed |
| Example 5 | 202.8 | 160.8 | Not developed |
| Example 6 | 203.7 | 175.1 | Not developed |
| Example 7 | 202.1 | 176.4 | Not developed |
| Example 8 | 200.3 | 135.8 | Not developed |
| Comparative Example 1 | 202.1 | 5.6 | Not developed |
| Comparative Example 2 | 199.7 | 4.0 | Not developed |
| Comparative Example 3 | 199.0 | 0.6 | Not developed |
| Comparative Example 4 | 199.6 | 199.4 | Developed |

As seen from the results, the stepped substrate-coating films in Examples 1 to 8 and Comparative Examples 1 to 3 did not develop sufficient solvent resistance (film curing property) by heating at 170° C. On the other hand, the stepped substrate-coating film in Comparative Example 4 developed sufficient solvent resistance by heating at 170° C.

[Test of Photocuring Property]

In Examples 1 to 8, the stepped substrate-coating compositions prepared in Production Examples 1 to 8, respectively, were each applied to a silicon wafer using a spin coater (spin coating). In Comparative Examples 1 to 3, the stepped substrate-coating compositions prepared in Comparative Production Examples 1 to 3, respectively, were each applied to a silicon wafer using a spin coater (spin coating). Subsequently, each of the compositions was heated on a hot plate at 170° C. for 1 minute to form a coating film having a thickness of 200 nm. The whole surface of the wafer of each of the stepped substrate-coating films was irradiated with light having a wavelength of 172 nm at approximately 500 mJ/cm$^2$ under a nitrogen atmosphere with a 172-nm light irradiating device SUS867 manufactured by USHIO INC. The stepped substrate-coating films were each immersed in a mixed solvent of propylene glycol monomethyl ether and propylene glycol monomethyl ether acetate at a ratio of 7:3 for 1 minute, spin-dried, and then heated at 100° C. for 30 seconds. The film thickness of the stepped substrate-coating films before and after immersion in the mixed solvent was measured with an optical interference thickness meter. The results of solvent resistance test are shown in Table 2. In Table 2, the initial thickness shows the film thickness before a test of solvent separation.

TABLE 2

| Examples | Initial film thickness (nm) | Film thickness after solvent separation (nm) | Solvent resistance |
|---|---|---|---|
| Example 1 | 199.1 | 198.5 | Developed |
| Example 2 | 200.4 | 199.8 | Developed |
| Example 3 | 199.2 | 198.9 | Developed |
| Example 4 | 198.3 | 198.2 | Developed |
| Example 5 | 193.6 | 193.6 | Developed |
| Example 6 | 195.6 | 196.1 | Developed |

TABLE 2-continued

| Examples | Initial film thickness (nm) | Film thickness after solvent separation (nm) | Solvent resistance |
|---|---|---|---|
| Example 7 | 199.9 | 199.5 | Developed |
| Example 8 | 199.6 | 199.1 | Developed |
| Comparative Example 1 | 195.3 | 194.3 | Developed |
| Comparative Example 2 | 197.1 | 196.1 | Developed |
| Comparative Example 3 | 203.6 | 202.2 | Developed |

As seen from the results, the stepped substrate-coating films in Examples 1 to 8 and Comparative Examples 1 to 3 did not develop sufficient solvent resistance (film curing property) only by heating at 170° C., but developed sufficient solvent resistance by irradiation with light having a wavelength of 172 nm.

[Test of Flattening Property on Stepped Substrate]

For evaluation of step-coating property, the thicknesses of coatings were compared on a stepped substrate in which an Si substrate had a trench width of 800 nm and a height of 200 nm and vapor deposition with SiN was performed so that the film thickness was 5 nm. In Examples 1 to 8, the stepped substrate-coating compositions prepared in Production Examples 1 to 8, respectively, were each applied to the aforementioned substrate so that the film thickness was 200 nm, and heated at 170° C. for 1 minute. In Comparative Examples 1 to 3, the stepped substrate-coating compositions prepared in Comparative Production Examples 1 to 3, respectively, were each applied to the aforementioned substrate so that the film thickness was 200 nm, and heated at 170° C. for 1 minute. The whole surface of the wafer of each of the stepped substrate-coating films was irradiated with light having a wavelength of 172 nm at approximately 500 mJ/cm$^2$ under a nitrogen atmosphere. The cross-sectional shape of each of the stepped substrates to which a heat stress was applied by heating at 215° C. for 1 minute was observed as step-coating property with a scanning electron microscope (S-4800) manufactured by Hitachi High-Technologies Corporation. The film thickness at a trench area and a non-trench area (open area) was measured. The film thickness at the trench area was the film thickness from the substrate at the open area and the interface of the coating film to the top of the coating film at the trench area. The film thickness at the open area was the film thickness from the substrate at the open area and the interface of the coating film to the top of the coating film at the open area. The difference between the film thickness at the open area and the film thickness at the trench area was measured. From the difference, flattening property on the stepped substrates was evaluated.

In Comparative Example 4, the stepped substrate-coating composition obtained in Comparative Production Example 4 was applied to the stepped substrate so that the film thickness was 200 nm, and heated at 215° C. for 1 minute in the same manner as above. The film thickness difference in this case is shown in Table 3.

TABLE 3

| Examples | Film thickness at trench area (nm) | Film thickness at open area (nm) | Film thickness difference (nm) |
|---|---|---|---|
| Example 1 | 139 | 173 | 34 |
| Example 2 | 135 | 167 | 32 |
| Example 3 | 129 | 153 | 24 |

TABLE 3-continued

| Examples | Film thickness at trench area (nm) | Film thickness at open area (nm) | Film thickness difference (nm) |
|---|---|---|---|
| Example 4 | 131 | 159 | 28 |
| Example 5 | 151 | 169 | 18 |
| Example 6 | 137 | 173 | 36 |
| Example 7 | 171 | 193 | 22 |
| Example 8 | 175 | 189 | 14 |
| Comparative Example 1 | −121 | 191 | 312 |
| Comparative Example 2 | −65 | 135 | 200 |
| Comparative Example 3 | −38 | 155 | 193 |
| Comparative Example 4 | 121 | 165 | 44 |

As seen from the results, in Examples 1 to 8 in which the stepped substrate-coating films exhibited solvent resistance by irradiation with light having a wavelength of 172 nm, the difference between the film thickness at the trench area and the film thickness at the open area was smaller than that in Comparative Examples 1 to 3. That was, even when a heat stress was applied by heating at 215° C. for 1 minute after solvent resistance was developed by irradiation with light, favorable flattening property can be developed. In Examples 1 to 8 in which the stepped substrate-coating films exhibited solvent resistance by irradiation with light having a wavelength of 172 nm, the difference between the film thickness at the trench area and the film thickness at the open area was smaller than that in Comparative Example 4 in which the stepped substrate-coating film exhibited solvent resistance by heating at 215° C. for 1 minute. Even when a heat stress is applied by heating at 215° C. for 1 minute, the stepped substrate-coating film formed by irradiation with light having a wavelength of 172 nm can develop favorable flattening property as compared with the stepped substrate-coating film formed by heating.

INDUSTRIAL APPLICABILITY

The stepped substrate-coating composition can be used as a stepped substrate-coating composition for forming a coating film on a substrate, which has high filling property of a pattern and flattening property capable of forming a coating film that does not cause degassing and thermal shrinkage.

The invention claimed is:

1. A photocurable stepped substrate-coating composition comprising:
    a compound (E) containing a partial structure (I) and a partial structure (II) that contains a hydroxy group formed by a reaction of an epoxy group with a proton-generating compound;
    a solvent (F); and
    a crosslinkable compound (H), wherein
    the partial structure (I) is at least one partial structure selected from the group consisting of partial structures of Formulae (1-1) to (1-5) described below, or a partial structure including a partial structure of Formula (1-6) in a combination with a partial structure of Formula (1-7) or (1-8), and
    the partial structure (II) is a partial structure of Formula (2-1) or (2-2) described below

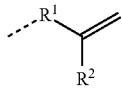

Formula (1-1)

-continued

Formula (1-2)
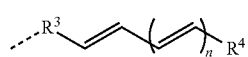

Formula (1-3)
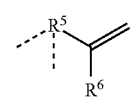

Formula (1-4)
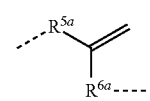

Formula (1-5)
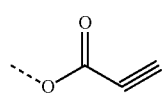

Formula (1-6)
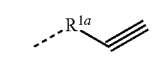

Formula (1-7)
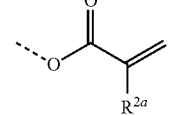

Formula (1-8)
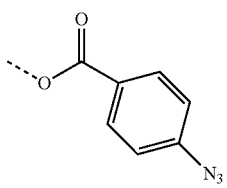

Formula (2-1)
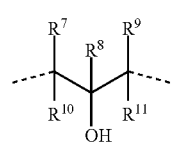

Formula (2-2)
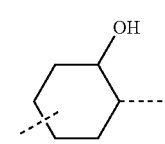

wherein $R^1$, $R^{1a}$, $R^3$, and $R^5$ are each independently a saturated $C_{1-10}$ hydrocarbon group, an aromatic $C_{6-40}$ hydrocarbon group, an oxygen atom, a carbonyl group, a sulfur atom, a nitrogen atom, an amide group, an amino group, or a group selected from combinations thereof, $R^{5a}$ and $R^{6a}$ are each independently a divalent group selected from a $C_{1-10}$ alkylene group, a $C_{6-40}$ arylene group, an oxygen atom, a carbonyl group, a sulfur atom, or combinations thereof, $R^2$, $R^{2a}$, $R^4$, and $R^6$ are each independently a hydrogen atom, a saturated $C_{1-10}$ hydrocarbon group, an unsaturated $C_{2-10}$ hydrocarbon group, an oxygen atom, a carbonyl group, an amide group, an amino group, or a group selected from combinations thereof, and are a monovalent group, $R^1$, $R^{1a}$, and $R^3$ are a divalent group, $R^5$ is a trivalent group, $R^7$, $R^8$, $R^9$, $R^{10}$, and $R^{11}$ are each independently a hydrogen atom or a saturated $C_{1-10}$ hydrocarbon group, n is the number of repeating units and is 1 to 10, and a dotted line is a chemical bond between adjacent atoms, wherein the compound (E) is selected from the group consisting of

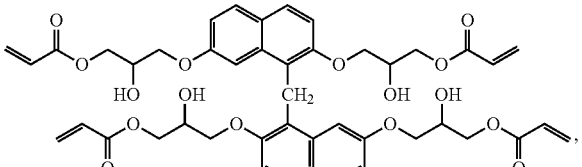

59
-continued
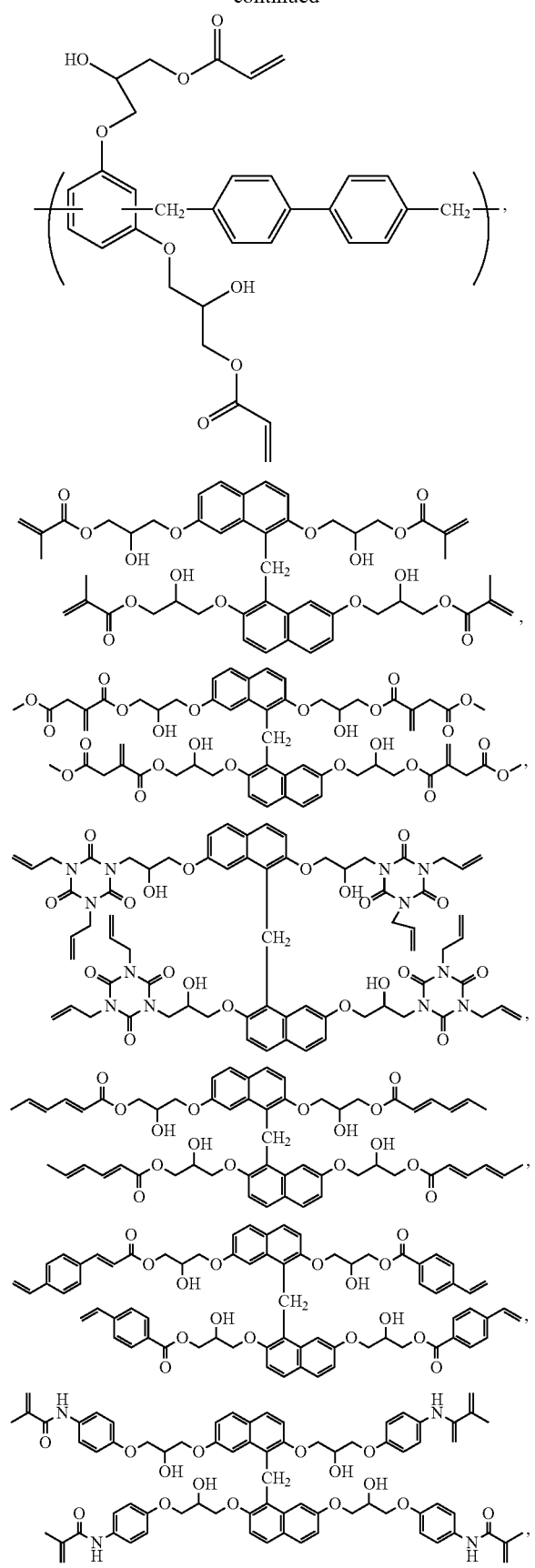
60
-continued
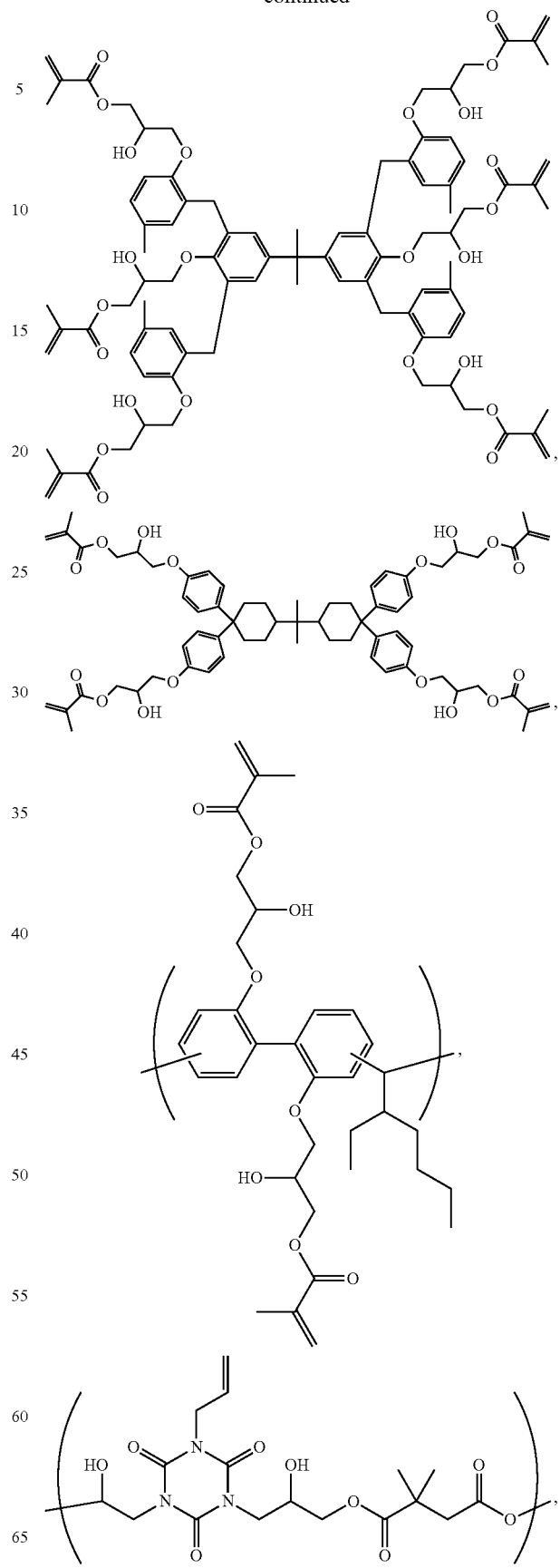

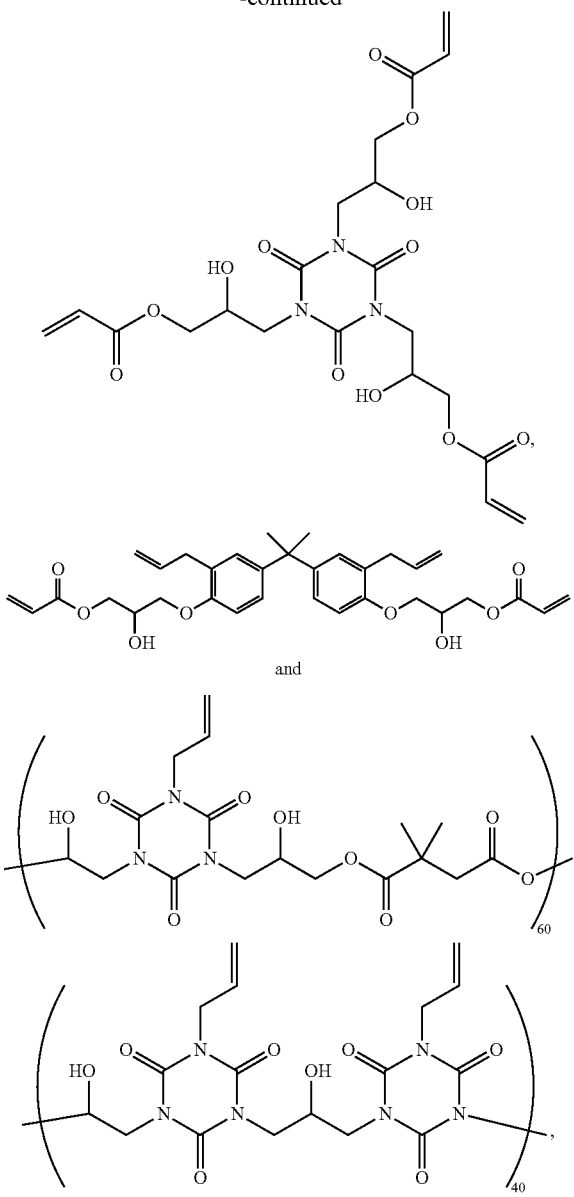

and wherein the photocurable stepped substrate-coating composition is a resist underlayer film-forming composition used in a lithography process in manufacturing of a semiconductor device.

2. The photocurable stepped substrate-coating composition according to claim 1, further comprising an acid catalyst.

3. The photocurable stepped substrate-coating composition according to claim 1, wherein the compound (E) contains the epoxy group and the hydroxy group at a molar ratio (epoxy group)/(hydroxy group) of 0 or more and 0.5 or less, and contains the partial structure (II) so that a molar ratio (partial structure (II))/(partial structure (I)+partial structure (II)) is 0.01 or more and 0.8 or less.

4. The photocurable stepped substrate-coating composition according to claim 1, wherein the compound (E) has the partial structure (I) and the partial structure (II) in a proportion of each of the partial structures (I) and (II) of 1 to 1,000 structures.

5. The photocurable stepped substrate-coating composition according to claim 1, wherein the resist underlayer film-forming composition has a property of both a photo-crosslinking function and a thermal crosslinking function.

6. A method for manufacturing a coated substrate comprising steps of (i) applying the photocurable stepped substrate-coating composition according to claim 1 to a stepped substrate, and (ii) exposing the composition.

7. The method for manufacturing a coated substrate according to claim 6, further comprising a step (ia) of heating the photocurable stepped substrate-coating composition at a temperature of 70 to 400° C. for 10 seconds to 5 minutes after the composition is applied in the step (i).

8. The method for manufacturing a coated substrate according to claim 6, wherein a wavelength of exposure light in the step (ii) is 150 nm to 248 nm.

9. The method for manufacturing a coated substrate according to claim 6, wherein an exposure dose in the step (ii) is 10 mJ/cm$^2$ to 3,000 mJ/cm$^2$.

10. The method for manufacturing a coated substrate according to claim 6, wherein the substrate has an open area (unpatterned area) and a pattern area including dense (DENCE) and crude (ISO) pattern areas, and an aspect ratio of pattern at the pattern area is 0.1 to 10.

11. The method for manufacturing a coated film according to claim 6, wherein a difference in level of coating (Bias) between the open area and the pattern area is 1 to 50 nm.

12. A method for manufacturing a semiconductor device comprising steps of:
    forming an underlayer film from the photocurable stepped substrate-coating composition according to claim 1 on a stepped substrate;
    forming a resist film on the underlayer film;
    forming a resist pattern by irradiation of the resist film with light or an electron beam and development;
    etching the underlayer film using the resist pattern formed to form a patterned underlayer film; and
    processing a semiconductor substrate by using the patterned underlayer film.

13. The method for manufacturing a semiconductor device according to claim 12, wherein the stepped substrate has an open area (unpatterned area) and a pattern area including dense (DENCE) and crude (ISO) pattern areas, and an aspect ratio of patterns at the pattern area is 0.1 to 10.

14. The method for manufacturing a semiconductor device according to claim 12, wherein the step of forming an underlayer film from the photocurable stepped substrate-coating composition includes steps of (i) applying the photocurable stepped substrate-coating composition to the stepped substrate and (ii) exposing the composition.

15. The method for manufacturing a semiconductor device according to claim 14, further comprising a step (ia) of heating the photocurable stepped substrate-coating composition at a temperature of 70 to 400° C. for 10 seconds to 5 minutes after the composition is applied in the step (i).

16. The method for manufacturing a semiconductor device according to claim 14, wherein a wavelength of exposure light in the step (ii) is 150 nm to 248 nm.

17. The method for manufacturing a semiconductor device according to claim 14, wherein an exposure dose in the step (ii) is 10 mJ/cm$^2$ to 3,000 mJ/cm$^2$.

18. The method for manufacturing a semiconductor device according to claim 12, wherein the underlayer film formed from the photocurable stepped substrate-coating composition has a difference in level of coating of 1 to 50 nm.

19. A method for manufacturing a semiconductor device comprising steps of:
- forming an underlayer film from the photocurable stepped substrate-coating composition according to claim 1 on a stepped substrate;
- forming a hard mask on the underlayer film;
- forming a resist film on the hard mask;
- forming a resist pattern by irradiation of the resist film with light or an electron beam and development;
- etching the hard mask using the resist pattern formed to form a patterned hard mask;
- etching the underlayer film using the patterned hard mask to form a patterned underlayer film; and
- processing a semiconductor substrate by using the patterned underlayer film.

20. The method for manufacturing a semiconductor device according to claim 19, wherein the stepped substrate has an open area (unpatterned area) and a pattern area including dense (DENCE) and crude (ISO) pattern areas, and an aspect ratio of patterns at the pattern area is 0.1 to 10.

21. The method for manufacturing a semiconductor device according to claim 19, wherein the step of forming an underlayer film from the photocurable stepped substrate-coating composition includes steps of (i) applying the photocurable stepped substrate-coating composition to the stepped substrate and (ii) exposing the composition.

22. The method for manufacturing a semiconductor device according to claim 21, further comprising a step (ia) of heating the photocurable stepped substrate-coating composition at a temperature of 70 to 400° C. for 10 seconds to 5 minutes after the composition is applied in the step (i).

23. The method for manufacturing a semiconductor device according to claim 21, wherein a wavelength of exposure light in the step (ii) is 150 nm to 248 nm.

24. The method for manufacturing a semiconductor device according to claim 21, wherein an exposure dose in the step (ii) is 10 mJ/cm$^2$ to 3,000 mJ/cm$^2$.

25. The method for manufacturing a semiconductor device according to claim 19, wherein the underlayer film formed from the photocurable stepped substrate-coating composition has a difference in level of coating of 1 to 50 nm.

* * * * *